United States Patent
Miura et al.

(10) Patent No.: US 10,134,850 B2
(45) Date of Patent: Nov. 20, 2018

(54) SEMICONDUCTOR DEVICE

(71) Applicant: Renesas Electronics Corporation, Tokyo (JP)

(72) Inventors: Yoshinao Miura, Tokyo (JP); Hironobu Miyamoto, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/679,600

(22) Filed: Aug. 17, 2017

(65) Prior Publication Data

US 2018/0097070 A1  Apr. 5, 2018

(30) Foreign Application Priority Data

Sep. 30, 2016  (JP) ................................. 2016-194299

(51) Int. Cl.
*H01L 29/20* (2006.01)
*H01L 23/66* (2006.01)
*H01L 29/778* (2006.01)
*H01L 29/205* (2006.01)

(52) U.S. Cl.
CPC .......... *H01L 29/2003* (2013.01); *H01L 23/66* (2013.01); *H01L 29/205* (2013.01); *H01L 29/7787* (2013.01)

(58) Field of Classification Search
CPC ... H01L 29/2003; H01L 29/205; H01L 23/66; H01L 29/7787
See application file for complete search history.

(56) References Cited

U.S. PATENT DOCUMENTS

| 8,513,983 | B2 | 8/2013 | Machida | |
| 2014/0264274 | A1* | 9/2014 | Nakayama | H01L 29/66462 257/20 |
| 2016/0056274 | A1* | 2/2016 | Kawaguchi | H01L 29/402 257/192 |
| 2016/0233311 | A1* | 8/2016 | Masumoto | H01L 29/66522 |
| 2016/0260615 | A1* | 9/2016 | Hirai | H01L 21/28114 |
| 2017/0317183 | A1* | 11/2017 | Kato | H01L 29/513 |
| 2018/0061983 | A1* | 3/2018 | Nakayama | H01L 29/4236 |

FOREIGN PATENT DOCUMENTS

JP  2011-188178 A  9/2011

* cited by examiner

*Primary Examiner* — Victor A Mandala
(74) *Attorney, Agent, or Firm* — Sughrue Mion, PLLC

(57) ABSTRACT

A semiconductor device includes a channel layer formed over a substrate, a barrier layer formed on the channel layer and a gate electrode. A second gate electrode section is formed on the gate electrode via a gate insulating film. It becomes possible to make an apparent threshold voltage applied to the second gate electrode of a MISFET higher than an original threshold voltage applied to the gate electrode for forming a channel under the gate electrode by providing an MIM section configured by the gate electrode, the gate insulating film and the second gate electrode in this way.

5 Claims, 28 Drawing Sheets

$$V_{ex} : V_{gs} = C_{gs} : C_{ex} \quad \cdots (1)$$

$$V_{ex} : V_{gs} = R_{ex} : R_{gs} \quad \cdots (2)$$

$$(I_{gs} = I_{leakage} @ V_{gs} = V_{on}) \quad \cdots (3)$$

SEMICONDUCTOR DEVICE

CROSS-REFERENCE TO RELATED APPLICATIONS

The disclosure of Japanese Patent Application No. 2016-194299 filed on Sep. 30, 2016 including the specification, drawings and abstract is incorporated herein by reference in its entirety.

BACKGROUND

The present invention relates to a semiconductor device and, in particular, relates to the semiconductor device which is favorably utilized in a field effect transistor using a nitride semiconductor.

The field effect transistor using the nitride semiconductor is operable at a high frequency and has high voltage withstand—low on-resistance characteristics. Therefore, the field effect transistor using the nitride semiconductor is excellent in high-speed switching operation performance and application of the field effect transistor to a switching power source, an inverter and so forth of a power electronics system, is expected.

For example, a normally-off type GaNFET is disclosed, for example, in Japanese Unexamined Patent Application Publication No. 2011-188178 (Japanese Patent No. 4968487). Then, it is disclosed that since a gate-to-source structure thereof is not an insulation structure as adopted in an existing silicon MOSFET as a feature of the normally-off type GaNFET, when an excessive gate drive voltage is applied to the GaNFET, a large current flows between the gate and the source. Therefore, it is disclosed that a series circuit which is configured by a voltage control circuit and a diode is coupled between the drain and the gate thereby to drive the transistor while suppressing a gate overvoltage applied to a wide bandgap semiconductor switch and without sacrificing switching characteristics and an on-resistance.

SUMMARY

The field effect transistor using the nitride semiconductor utilizes a two-dimensional electron gas which is generated at a hetero-interface between a channel layer (made of, for example, GaN) and a barrier layer (made of, for example, AlGan) with positive polarization charges peculiar to the nitride semiconductor. Owing to utilization of the two-dimensional electron gas, it is possible to reduce access resistances between the source and the gate and between the gate and the drain. In addition, part of a channel layer (made of, for example, GaN) is removed to form a recessed part and a MIS gate structure is formed in the recessed part, and thereby it is possible to realize a normal-off operation. It becomes possible to realize an operation which is similar to that of a MIS type field effect transistor using the existing silicon semiconductor by a MIS (Metal Insulator Semiconductor) type field effect transistor using such a nitride semiconductor.

The inventors and others of the present invention are engaged in research and development of the field effect transistor using the nitride semiconductor and adopted the MIS type structure and examined a threshold value obtained by this field effect transistor using the nitride semiconductor. Although the threshold value is increased or decreased depending on the interface properties of the MIS structure, a low value ranging from about 0 V to about 1 V is obtained. In order to make this threshold value close to a threshold value (for example, about 3 V) which is equivalent to a threshold value obtained from, for example, the MIS type field effect transistor using the existing silicon semiconductor, it is requested to improve the structure of the field effect transistor using the nitride semiconductor.

Other matters to be solved by the present invention and novel features of the present invention will become apparent from description of the specification and the appended drawings.

A summary of a representative embodiment in embodiments disclosed in the present application will be briefly described as follows.

A semiconductor device according to one embodiment disclosed in the present application includes a first nitride semiconductor layer which is formed over a substrate, a second nitride semiconductor layer which is formed on the first nitride semiconductor layer and a first gate electrode section which is formed on the first nitride semiconductor layer or the second nitride semiconductor layer. Then, a second gate electrode section is arranged on the first gate electrode section via an insulating film.

According to the semiconductor device indicated in each representative embodiment which is disclosed in the present application and will be described in the following, it becomes possible to improve the characteristics of the semiconductor device.

DETAILED DESCRIPTION

Figure 1:
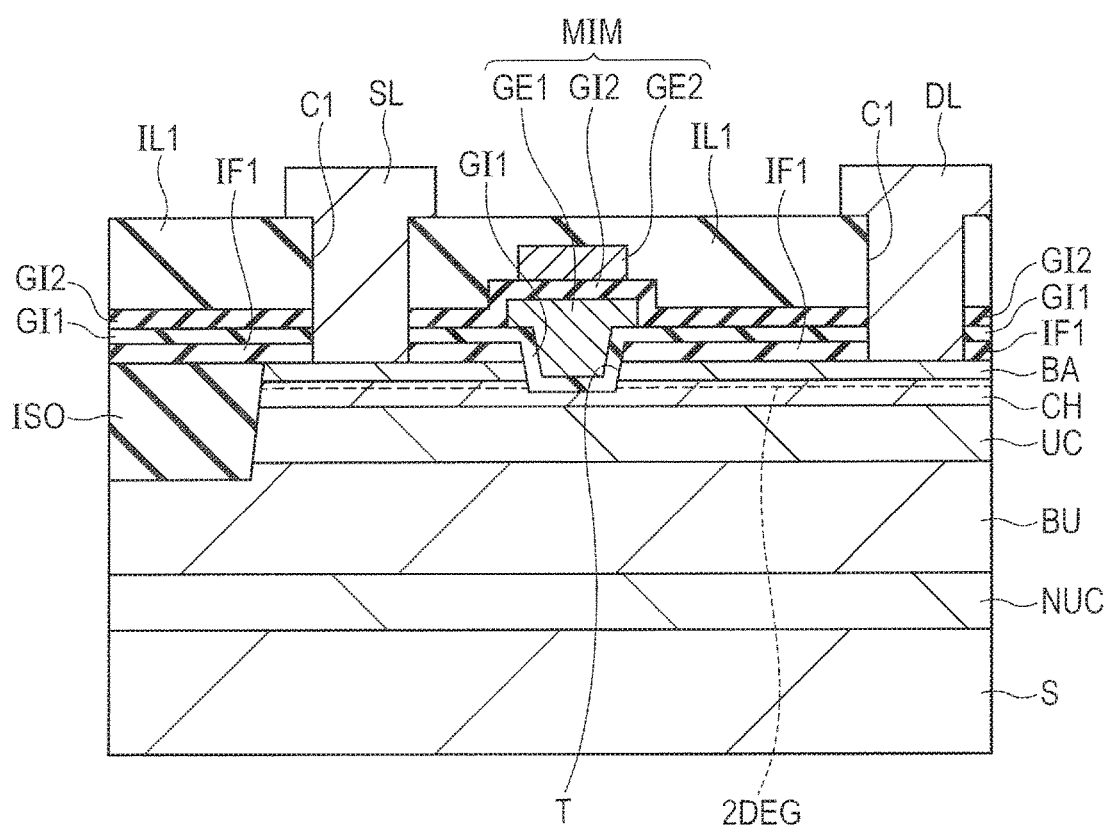
FIG. 1 is a sectional diagram illustrating one example of a configuration of a semiconductor device according to a first embodiment.

Although, in the following embodiments, description will be made by dividing into a plurality of sections or embodiments when division is requested for the convenience sake, these are not unrelated to one another and these are related to one another such that one covers some or all of altered examples, application examples, detailed explanations, supplemental explanations and so forth of the others unless otherwise clearly stated in particular. In addition, in the following embodiments, in a case where the number of constitutional elements and so forth (the number of units, a numerical value, an amount/a quantity, a range and so forth are included) is referred to, it is not limited to the specific number and may be at least and/or not more than the specific number unless otherwise clearly stated in particular and unless otherwise definitely limited to the specific number in principle.

Further, in the following embodiments, the constitutional elements (operation steps and so forth are also included) thereof are not necessarily essential unless otherwise clearly stated in particular and unless otherwise thought to be clearly essential in principle. Likewise, in the following embodiments, when the shapes of the constitutional elements and so forth, a positional relationship among them and so forth are referred to, the ones that are substantially approximate or similar to the shapes and so forth shall be included unless otherwise clearly stated in particular and unless otherwise clearly thought that they are not approximate or similar thereto in principle. The same is true of the above-mentioned number of constitutional elements and so forth (the number of units, the numerical value, the amount/the quantity, the range and so forth are included).

In the following, preferred embodiments of the present invention will be described in detail. Incidentally, in all of the drawings illustrated for description of the embodiments, the same or related symbols are assigned to the members having the same functions and repetitive description thereof is omitted. In addition, in a case where there exist a plurality of similar members (parts), there are cases where an individual or specific part is indicated by adding a mark to the general symbol assigned to that member or part. In addition, in the following description of the embodiments, description of the same or similar part will not be repetitively made in principle unless otherwise particularly requested.

In addition, in the drawings used for description of the embodiments, there are cases where even a sectional diagram is illustrated in a hatching-omitted state for easy reading of the drawing. In addition, there are also cases where even a plan view is illustrated in a hatched state for easy reading of the drawing.

In addition, in the sectional diagrams and the plan views, the size of each part does not correspond to that of an actual device and there are cases where a specific part is illustrated in a relatively enlarged state for easy understanding of the drawing. In addition, also in a case where one sectional diagram is illustrated in correspondence with one plan view, there are cases where a specific part is illustrated in the relatively enlarged state for easy understanding of the drawing.

First Embodiment

In the following, a semiconductor device according to a first embodiment of the present invention will be described in detail with reference to the drawings.

[Description of Structure]

Figure 2:
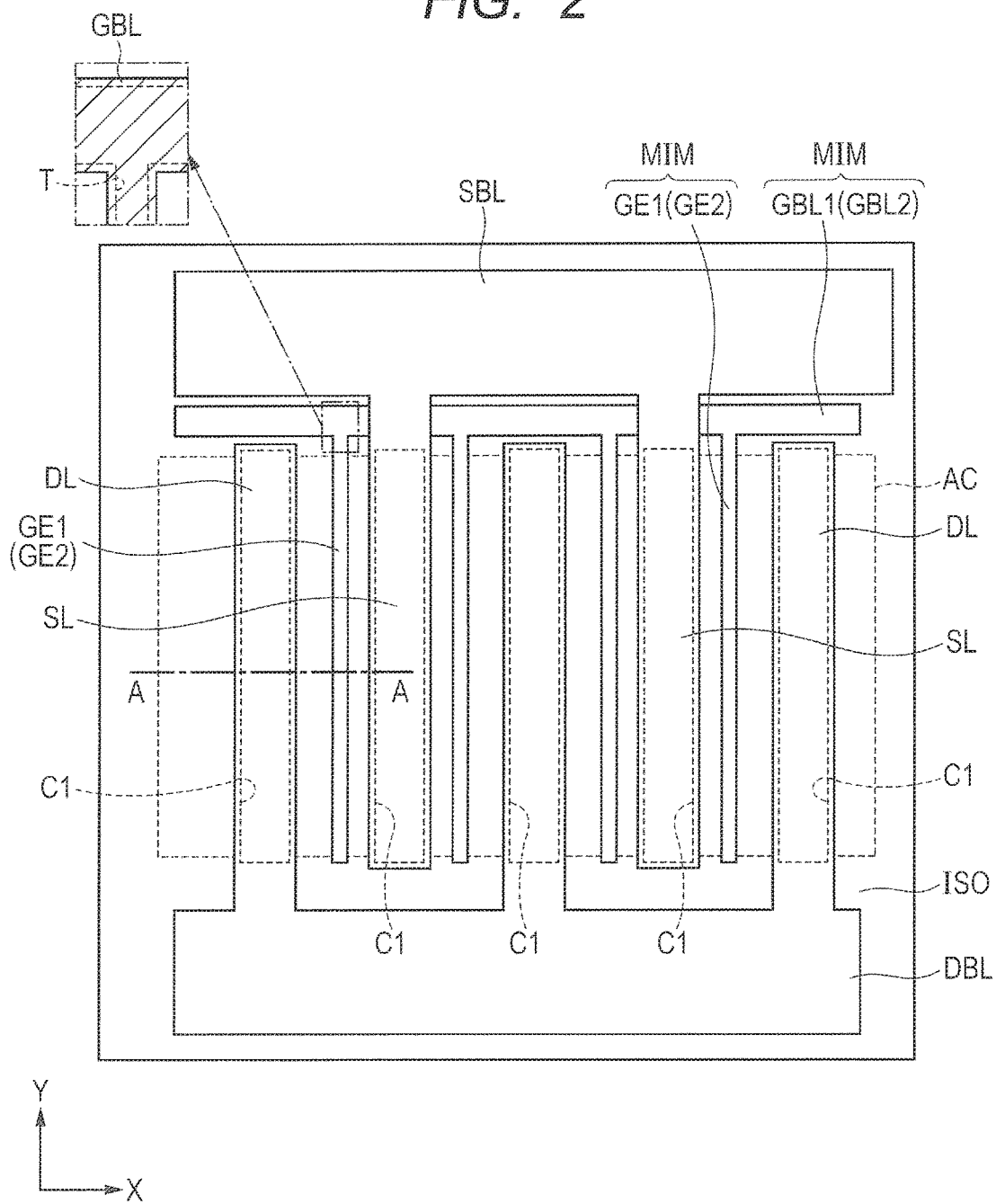
FIG. 2 is a plan view illustrating one example of the configuration of the semiconductor device according to the first embodiment.

FIG. 1 is a sectional diagram illustrating one example of a configuration of the semiconductor device according to the first embodiment. FIG. 2 is a plan view illustrating one example of the configuration of the semiconductor device according to the first embodiment. FIG. 1 corresponds to, for example, an A-A sectional part in FIG. 2. The semiconductor device (a semiconductor element) according to the first embodiment illustrated in FIG. 1 and so forth is an MIS type field effect transistor (FET) using a nitride semiconductor. It is possible to use the semiconductor device according to the first embodiment as a high electron mobility transistor (HEMT) type power transistor. The semiconductor device according to the first embodiment is a so-called recessed gate type semiconductor device.

As illustrated in FIG. 1, in the semiconductor device according to the first embodiment, a nucleation layer NUC and a buffer layer BU are formed on a substrate S.

A semiconductor substrate of the type that, for example, a (111) surface is exposed and which is made of silicon (Si) may be used as the substrate S. Substrates which are made of SiC, sapphire and so forth may be also used as the substrate S in addition to the above-mentioned substrate which is made of silicon. In addition, a substrate which is made of GaN may be also used. In a case where the GaN substrate is used, provision of the nucleation layer NUC may be omitted.

The nucleation layer NUC is configured by a nitride semiconductor layer. For example, an aluminum nitride (AlN) layer may be used as the nucleation layer NUC. The buffer layer BU is configured by one or a plurality of nitride semiconductor layers prepared by adding an impurity which forms a deep level to the nitride semiconductor. As a super-lattice constituent body (also called a super-lattice layer) which is configured by the plurality of nitride semiconductor layers, for example, the super-lattice constituent body which is prepared by repetitively laminating a laminated film (an AlN/GaN film) of a gallium nitride (GaN) layer and an aluminum nitride (AlN) layer may be used as the buffer layer BU. A laminated body prepared by further laminating an undoped AlGaN layer (an i-AlGaN layer) on the super-lattice constituent body may be also used as the buffer layer BU. The gallium nitride (GaN) layer, an aluminum gallium nitride (AlGaN) layer, the aluminum nitride (AlN) layer, or a laminated film thereof may be used as the buffer layer BU.

Incidentally, in general, the nitride semiconductor layers (group III-V compound semiconductor layers) on the substrate S are all formed by group III element facetted growth.

A channel underlying layer UC, a channel layer CH and a barrier layer BA are sequentially formed on the buffer layer BU.

The channel underlying layer UC is configured by the nitride semiconductor layer. The channel underlying layer UC is almost equal to the underlying buffer layer BU (UC≠BU) in electron affinity (a difference between a conduction band edge level and a vacuum level of the semiconductor). However, the electron affinity of the channel underlying layer UC may be larger than that of the buffer layer BU (UC>BU). The channel underlying layer UC is configured by, for example, the undoped AlGaN layer.

The channel layer CH is configured by the nitride semiconductor layer and is also called an electron transit layer. The channel layer CH is almost equal to or larger than the buffer layer BU and the channel underlying layer UC in electron affinity (CH≥BU, CH≥UC). The channel layer CIT is configured by, for example, a GaN layer. An InGaN layer may be used as the channel layer CH.

The barrier layer BA is configured by the nitride semiconductor layer and is smaller than the channel layer CH in electron affinity (BA<CH). The barrier layer BA is configured by, for example, the AlGaN layer. An InAlN layer, an AlInGaN layer and so forth may be used as the barrier layer BA in addition to the AlGaN layer.

An insulating film IF1 is formed on the barrier layer BA. Incidentally, another nitride semiconductor layer (a cap layer) may be provided between the insulating film IF1 and the barrier layer BA. The cap layer is larger than the barrier layer BA in electron affinity.

In addition, the MISFET according to the first embodiment includes a gate electrode GE1 which is formed over the channel layer CH via a gate insulating film GI1 and a gate electrode GE2 which is formed on the gate electrode GE1 via a gate insulating film GI2. Then, the MISFET further includes a source line SL and a drain line DL which are formed on the barrier layer BA respectively on the both sides of the gate electrode GE1 (GE2).

The source line SL and the drain line DL each is configured by, for example, a laminated film of an underlying metal film and a metal film.

Figure 4:
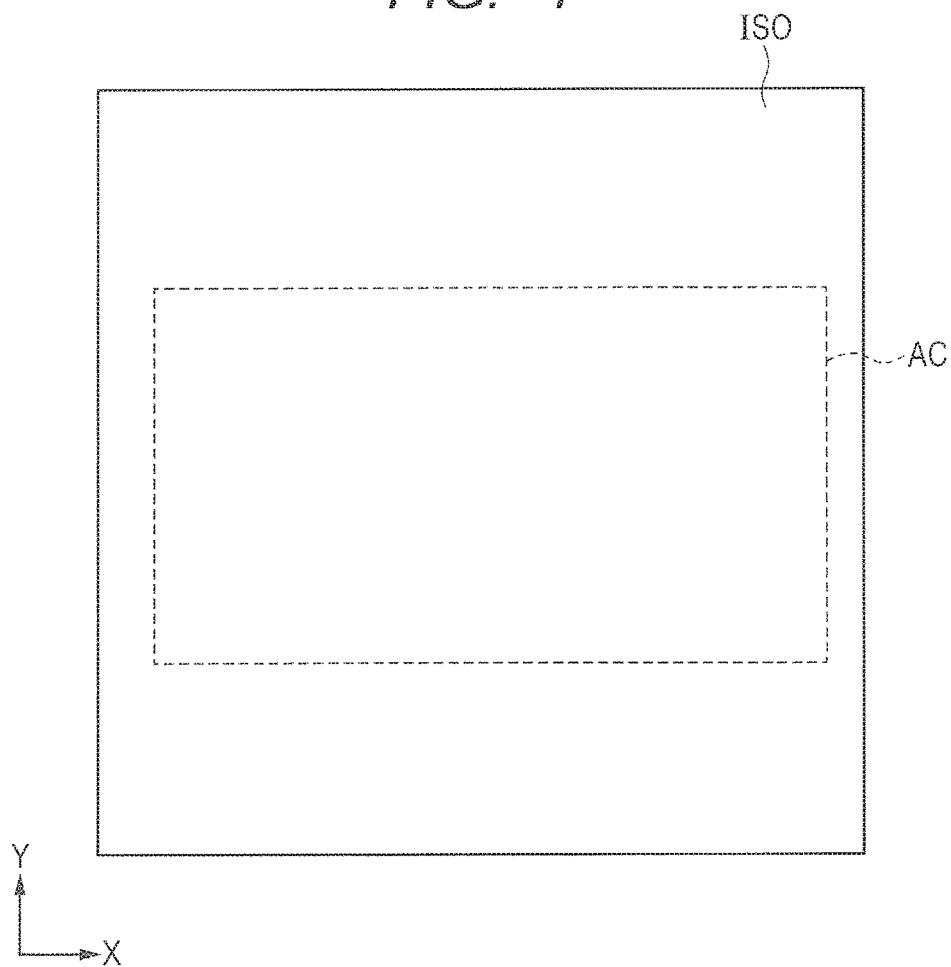
FIG. 4 is a plan view illustrating one example of the manufacturing process of the semiconductor device according to the first embodiment.

The MISFET is formed in an active region (AC) which is partitioned by an element separation region ISO (see FIG. 2 and FIG. 4). In addition, the gate electrode GE1 is formed in a trench (also called a recess) T which passes through the barrier layer BA and reaches the middle of the channel layer CH via the gate insulating film GI1.

A two-dimensional electron gas (2DEG) is generated on the channel layer CH side in the vicinity of an interface between the channel layer CH and the barrier layer BA. In addition, in a case where a positive voltage (a first threshold voltage) has been applied to the gate electrode GE1, a channel is formed in the vicinity of an interface between the gate insulating film GI1 and the channel layer CH.

The above-mentioned two-dimensional electron gas (2DEG) is formed by the following mechanism. The nitride semiconductor layers (here, gallium nitride-based semiconductor layers) which configure the channel layer CH and the barrier layer BA are different from each other in electron affinity. The barrier layer BA is configured by the nitride semiconductor which is smaller in electron affinity than the nitride semiconductor which configures the channel layer CH. Therefore, a well-type potential is generated on a bonding surface of these semiconductor layers. Electrons are stored in the well-type potential and thereby the two-dimensional electron gas (2DEG) is generated in the vicinity of the interface between the channel layer CH and the barrier layer BA.

Then, the two-dimensional electron gas (2DEG) which is generated in the vicinity of the interface between the channel layer CH and the barrier layer BA is divided by the trench T in which the gate electrode GE1 is formed. Therefore, in the semiconductor device according to the first embodiment, it is possible to maintain an off state in a state where the positive voltage (the first threshold voltage) is not applied to the gate electrode GE1 and to maintain an on state in a state where the positive voltage (the first threshold voltage) is being applied to the gate electrode GE1. It is possible to perform a normally-off operation in this way.

Then, a planar layout of the semiconductor device according to the first embodiment will be described (see FIG. 2).

As illustrated in FIG. 2, the planar shape of the drain line DL is one rectangle having the long side in a Y-axis direction. The plurality of line-shaped drain lines DL are arranged in an X-axis direction at constant intervals. In addition, the planar shape of the source line SL is another rectangle having the long side in the Y-axis direction. The plurality of line-shaped source lines SL are arranged in the X-axis direction at constant intervals. Then, each of the plurality of source lines SL and each of the plurality of drain lines DL are alternately arranged in the X-axis direction.

One contact hole C1 which serves as a coupling part of the drain line DL with a drain region is arranged under the drain line DL. The planar shape of the contact hole C1 is, for example, still another rectangle having the long side in the Y-axis direction. Another contact hole C1 which serves as a coupling part of the source line SL with a source region is arranged under the source line SL. The planar shape of the contact hole C1 is yet another rectangle having the long side in the Y-axis direction.

Then, the gate electrode GE1 is arranged between the drain region under the drain line DL and the source region under the source line SL. The gate electrode GE1 has a further rectangle having the long side in the Y-axis direction. The two (one pair of) gate electrodes GE1 are arranged on the both sides of one source region (the contact hole CI part under the source line SL). Every two gate electrodes GE1 are repetitively arranged in correspondence with each of the plurality of source regions in this way.

The plurality of drain lines DL are coupled together by a drain bus line DBL. The drain bus line DBL is arranged so as to extend in the X-axis direction on one-end side (on the lower side in FIG. 2) of the drain lines DL. In other words, the plurality of drain lines D1 are arranged so as to project from the drain bus line DBL which extends in the X-axis direction in the Y-axis direction. Such a shape is called a pectinate shape in some cases.

In addition, the drain bus line DEL is coupled with a not illustrated drain pad (also called a terminal area).

The plurality of source lines SL are coupled together by a source bus line SBL. The source bus line SBL is arranged on the other-end side (on the upper side in FIG. 2) of the source lines SL so as to extend in the X-axis direction. In other words, the plurality of source lines SL are arranged so as to project from the source bus line SBL which extends in the X-axis direction in the Y-axis direction. Such a shape is also called the pectinate shape in some cases.

The plurality of gate electrodes GE1 are coupled together by a gate bus line GBL1. The gate bus line GBL1 is arranged on one-end side (on the upper side in FIG. 2) of the gate electrodes GE1 so as to extend in the X-axis direction. In other words, the plurality of gate electrodes GE1 are arranged so as to project from the gate bus line GBL1 which extends in the X-axis direction in the Y-axis direction. Incidentally, there are cases where the plurality of gate electrodes GE1 and the gate bus line GBL1 are collectively called the gate electrode GE1.

In addition, the plurality of gate electrodes GE2 are coupled together by a gate bus line GBL2. The gate bus line GBL2 is arranged on one-end side (on the upper side in FIG. 2) of the gate electrodes GE2 so as to extend in the X-axis direction. In other words, the plurality of gate electrodes GE2 are arranged so as to project from the gate bus line GBL2 which extends in the X-axis direction in the Y-axis direction. Incidentally, there are cases where the plurality of gate electrodes GE2 and the gate bus line GBL2 are collectively called the gate electrode GE2.

Figure 20:
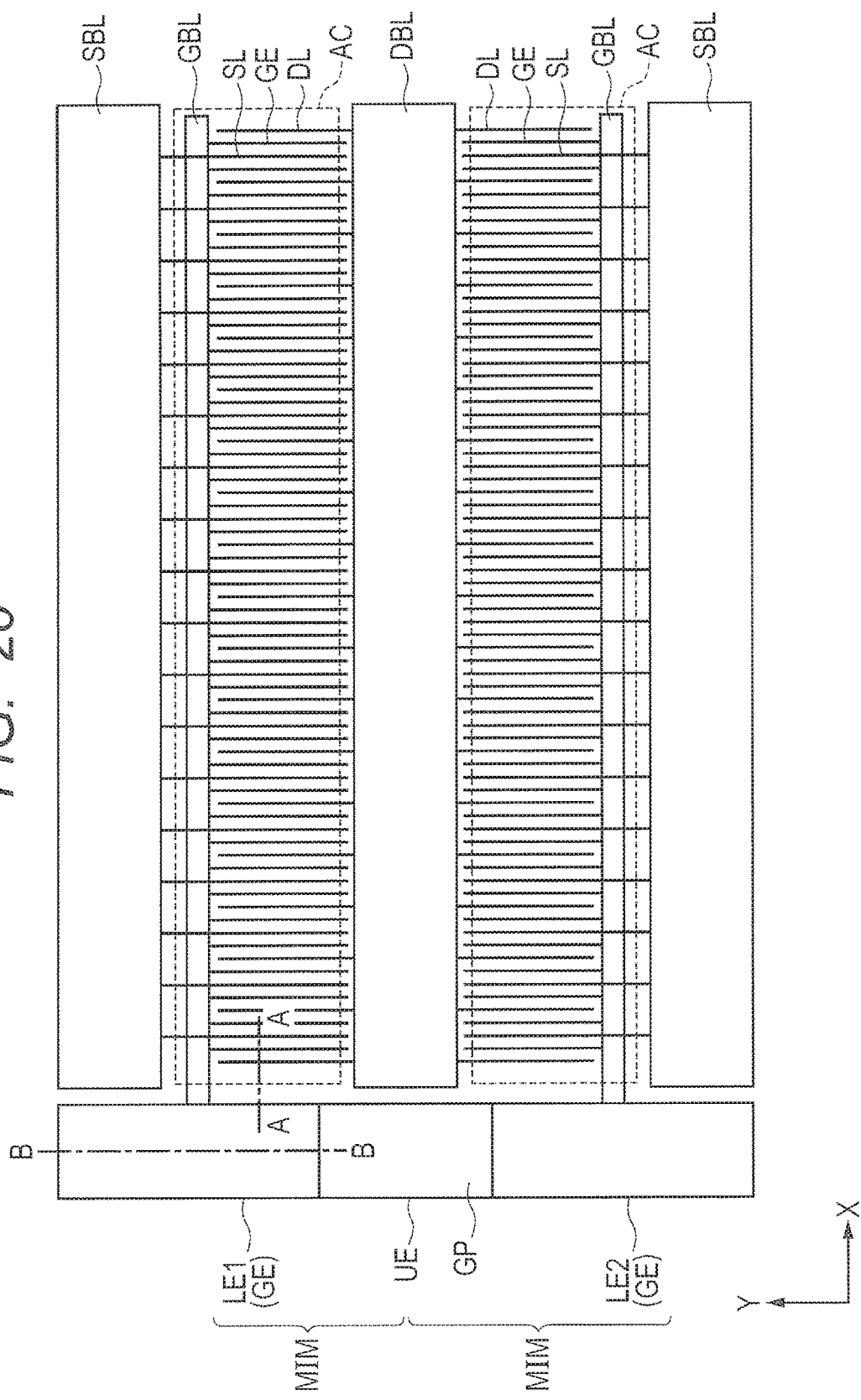
FIG. 20 is a plan view illustrating one example of a configuration of a semiconductor device according to a second embodiment.

Then, the gate bus line GBL2 is coupled with, for example, a gate pad (GP) which is arranged on one side in the X-axis direction of the gate bus line GBL2 (for example, on the left side in FIG. 2 and see FIG. 20). The gate bus line GBL1 is not coupled with the gate pad (GP). That is, a drive voltage is applied to the gate bus line GBL2 and the gate electrodes GE2 via the gate pad (GP). On the other hand, the gate bus line GBL1 and the gate electrodes GE1 are electrically separated from the gate bus line GBL2 and the gate electrodes GE2 by the gate insulating film GI2. The gate bus line GBL1 and the gate electrodes GE1 are in floating states.

The whole shape of the plurality of gate electrodes GE1 and the gate bus line GBL1 is the same as or similar to that of the plurality of gate electrodes GE2 and the gate bus line GBL2 in planar view. It is possible to configure an MIM section (MIM) by arranging the plurality of gate electrodes GE1 and the gate bus line GBL1 so as to face the plurality of gate electrodes GE2 and the gate bus line GBL2 via the gate insulating film GI2 in this way. Incidentally, it is not requested that the gate electrode GE1 (that is, the plurality of gate electrodes GE1 and the gate bus line GBL1) and the gate electrode GE2 (that is, the plurality of the gate electrodes GE2 and the gate bus line GBL2) be the same as each other in shape and completely overlap each other. For example, the gate electrode GE2 (that is, the plurality of gate electrodes GE2 and the gate bus line GBL2 ) may be made slightly smaller or larger than the gate electrode GE1 (that is, the plurality of the electrodes GE1 and the gate bus line GBL1). It is possible to configure the MIM section by at least partially overlapping the gate electrode GE2 (that is, the plurality of gate electrodes GE2 and the gate bus line GBL2 ) and the gate electrode GE1 (that is, the plurality of gate electrode GE1 and the gate bus line GBL1) each other in this way. However, the larger overlapping parts are, the more the capacitance of the MIM section MIM is increased and the more a voltage dividing effect which will be described later is improved.

Incidentally, the gate electrodes GE1 and GE2 may be shaped so as to project toward the drain line DL side. Electric field concentrations on the drain line DL-side ends of the gate electrodes GE1 and GE2 are relaxed by projecting the gate electrodes GE1 and GE2 toward the drain line DL side in this way (a field plate effect).

Here, the above-mentioned source line SL, drain line DL and gate electrode GE1 (GE2) are mainly arranged in the active region AC (a broken-line region in FIG. 2) surrounded by the element separation region ISO. The planar shape of the active region AC is a rectangle having the long side in the X-axis direction. On the other hand, the drain bus line DBL, the drain pad (not illustrated), the gate bus lines GBL1 and GBL2, the gate pad (not illustrated, see FIG. 20), the source bus line SBL, and a source pad (not illustrated) are arranged on the element separation region ISO. The gate bus line GBL1 (GBL2) is arranged between the active region AC and the source bus line SBL.

The above-mentioned active region AC, the various wiring the drain bus line DBL, the source bus line SBL and the gate bus lines GBL1 and GBL2 and the various pads (the drain pad, the gate pad and the source pad) are arranged in a chip region. The chip region is configured by a plurality of rectangular regions arranged on a wafer (the substrate). Each semiconductor chip is cut out of the wafer by dicing a scribe region between the chip regions. In addition, the above-mentioned source pad, drain pad and gate pad are coupled with external terminals via bonding wires respectively.

Here, in the first embodiment, the gate electrode GE2 is formed on the gate electrode GE1 via the gate insulating film GI2. That is, the MIM (Metal-Insulator-Semiconductor) section which is configured by the gate electrode GE1, the gate insulating film GI2 and the gate electrode GE2 is provided. Thereby, the MIM section (a capacitor section) is serially coupled with the wiring line and between the gate pad and the gate electrode GE1 to which the drive voltage is applied.

It becomes possible to apply a second drive voltage (a second threshold voltage) which is applied to the gate electrode GE2 dividedly to the MIM section (the capacitor section) and a gate capacitor (the capacitor which is configured by the gate electrode GE1, the gate insulating film GI1 and the channel layer CH) by providing such a MIM section. That is, it is possible to reduce the gate voltage (the first drive voltage or the first threshold voltage) which is applied to the gate electrode GE1 of the MISFET. In other words, it becomes possible to make the apparent gate voltage (the second drive voltage or the second threshold voltage) which is applied to the gate electrode GE2 of the MISFET higher than the original gate voltage (the first drive voltage or the first threshold voltage) which is applied to the gate electrode GE1 in order to form a channel under the gate electrode GE1.

In particular, in a general MISFET using the nitride semiconductor, there is a tendency that the thicker the film thickness of the gate insulating film is, the lower the threshold voltage becomes under the influence of positive fixed charges generated at the interface between the gate insulating film and the nitride semiconductor. It is difficult, to control on/off operation of the MISFET at the low threshold voltage. When the gate insulating film is thinned in order to increase the threshold voltage, the gate drive voltage is reduced and an operating margin of the MISFET is reduced. Then, for example, it becomes difficult to apply a driver which is similar to that of the MISFET using a silicon semiconductor to the general MISFET using the nitride semiconductor.

On the other hand, in the first embodiment, it becomes possible to increase the apparent gate voltage (the second drive voltage or the second threshold voltage) by providing the MIM section which is configured by the gate electrode GE1, the gate insulating film GI2 and the gate electrode GE2 and, for example, application of the driver which is similar to that of the MISFET using the silicon semiconductor to the MISFET using the nitride semiconductor becomes possible. For example, it is possible to drive the gate electrode GE2 by using the driver for the MISFET using the silicon semiconductor.

As will be described in the column of "First Example" which will be described later, according to the semiconductor device of the first embodiment, it becomes possible to increase the apparent voltage (the second drive voltage or the second threshold voltage) two, three or more times the original gate voltage (the first drive voltage or the first threshold voltage). Thereby, it becomes possible to increase a range of the gate drive voltages two, three or more times the original range. In addition, since the gate capacitance viewed from, the driver side becomes less than ½ to ⅓ the original capacitance, it becomes possible to reduce a switching time. In addition, the overall characteristic of the chip is stabilized by adopting a structure which includes the gate insulating film and is sufficiently little in gate leakage current.

Further, in the first embodiment, since the MIM section is configured so as to be incorporated into the semiconductor element, it becomes possible to promote downsizing of the semiconductor device in comparison with a case where an externally attached capacitor is coupled. In addition, it is possible to maintain the stable operating characteristic.

[Description of Manufacturing Method]

Next, a method of manufacturing the semiconductor device according to the first embodiment will be described with reference to FIG. 3 to FIG. 14 and a configuration of the semiconductor device will be more clarified. FIG. 3 to FIG. 14 are sectional diagrams and plan views illustrating one example of a manufacturing process of the semiconductor device according to the first embodiment.

Figure 3:
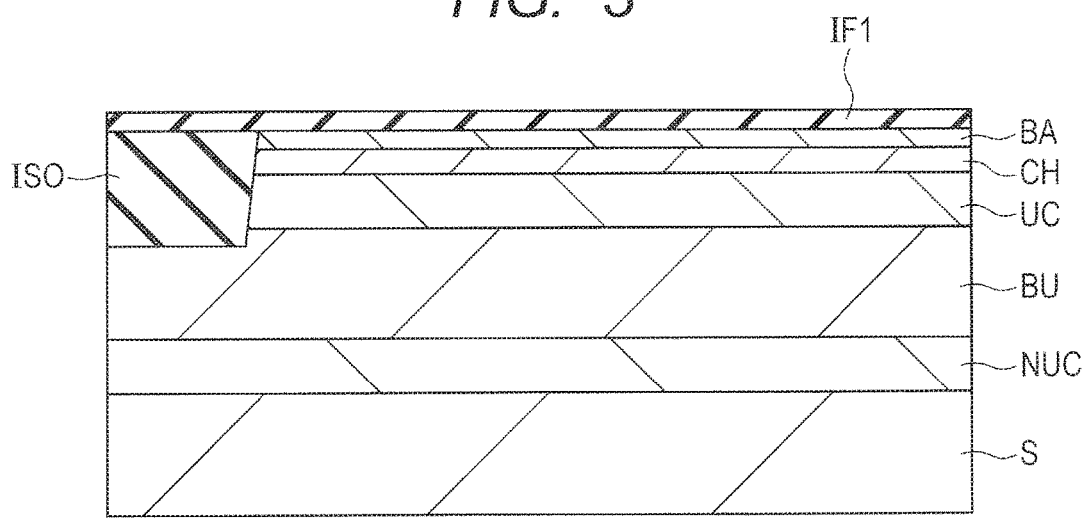
FIG. 3 is a sectional diagram illustrating one example of a manufacturing process of the semiconductor device according to the first embodiment.

As illustrated in FIG. 3, the nucleation layer NUC, the buffer layer BU, the channel underlying layer UC, the channel layer CH and the barrier layer BA are sequentially formed on the substrate S.

For example, a semiconductor substrate which is made of p-type silicon (Si) and the (111) surface of which is exposed is used as the substrate S and, for example, an aluminum nitride (AlN) layer is hetero-epitaxially grown over the substrate S by using a metal organic chemical vapor deposition (MOCVD) method and so forth as the nucleation layer NUC so as to have a film thickness of about 200 nm.

Incidentally, substrates made of SiC, sapphire and so forth may be used as the substrate S in addition to the above-mentioned silicon substrate. In addition, a substrate made of GaN may be also used. In a case where the substrate which is made of GaN is used, provision of the nucleation layer NUC may be omitted. Further, in general, the nucleation layer NUC and the nitride semiconductor layers (group III-V compound semi conductor layers) to be sequentially formed after formation of the nucleation layer NUC are all formed by group III element facetted growth (that is, in this case, gallium facetted growth or aluminum facetted growth).

Then, a superlattice constituent body in which a laminated film (an AlN/GaN film) of a gallium nitride (GaN) layer and an aluminum nitride (AlN) layer is repetitively laminated is formed on the nucleation layer NUC as the buffer layer BU. For example, the gallium, nitride (GaN) layer having a film thickness of about 20 nm and the aluminum nitride (AlN) layer having a film thickness of about 5 nm are hetero-epitaxially grown alternately by using the metal organic chemical vapor deposition method and so forth. For example, forty layers of the laminated films are formed.

Then, an AlGaN layer may be formed on the superlattice constituent body as part of the buffer layer BU. In this case, for example, the AlGaN layer is hetero-epitaxially grown on the superlattice constituent body by using the metal organic chemical vapor deposition method and so forth. On this occasion, the AlGaN layer is grown without performing intentional impurity doping. A film thickness of the AlGaN layer is, for example, about 1000 nm. In a case where the composition of Al is expressed as, for example, $Al_xGa_{1-x}N$, X is more than 0 and less than 0.15.

Then, the channel underlying layer UC is formed on the buffer layer BU. For example, another AlGaN layer is hetero-epitaxially grown on the buffer layer BU as the channel underlying layer UC by using the metal organic chemical vapor deposition method and so forth. On this occasion, the AlGaN layer is grown without performing intentional impurity doping. A film thickness thereof is, for example, about 200 nm. In a case where the composition of Al is expressed as, for example, $Al_yGa_{1-y}N$, Y is more than. 0 and less than 0.15.

Then, the channel layer CH is formed on the channel underlying layer UC. For example, a GaN layer is hetero-epitaxially grown on the channel underlying layer UC by using the metal organic chemical vapor deposition method and so forth. On this occasion, the GaN layer is grown without performing intentional impurity doping. A film thickness of the channel layer CH is, for example, about 500 nm.

Then, for example, still another AlGaN layer is hetero-epitaxially grown on the channel layer CH as the barrier layer BA by using the metal organic chemical vapor deposition method and so forth. On this occasion, the AlGaN layer is grown without performing intentional impurity doping. A film thickness thereof is, for example, about 20 nm. In a case where the composition of Al is expressed as, for example, $Al_ZGa_{1-Z}N$, Z is larger than X and Y and smaller than 0.4 (X<Z<0.4, Y<Z<0.4). Incidentally, an n-type impurity (for example, Si and so forth) may be doped into the barrier layer BA.

A laminated body of the channel underlying layer UC, the channel layer CH and the barrier layer BA is formed in this way. In the laminated body, the two-dimensional electron gas (2DEG) is generated in the vicinity of the interface between the channel layer CH and the barrier layer BA.

Then, another nitride semiconductor layer (the cap layer) may be formed on the barrier layer BA. For example, a gallium, nitride layer (a GaN layer) is hetero-epitaxially grown on the barrier layer BA by using the metal organic chemical vapor deposition method and so forth. On this occasion, the GaN layer is grown without performing intentional impurity doping. A film thickness of the cap layer is, for example, about 2 nm. Incidentally, the n-type impurity (for example, Si and so forth) may be doped into the cap layer.

Then, a silicon nitride film is deposited on the barrier layer BA as the insulating film IF1 by using a PECVD (plasma-enhanced chemical vapor deposition) method and so forth so as to have a film thickness of, for example, about 100 nm.

Then, a photoresist film (not illustrated) for forming an opening in the element separation region is formed on the insulating film IF1 by a photolithographic process. Then, the element separation region ISO is formed by implanting boron ions into the laminated body by using the photoresist film as a mask. A crystal state of the laminated body is changed and the laminated body is made highly resistive by implanting ion species such as boron (B), nitrogen (N) and so forth into the laminated body.

For example, the boron ions are implanted into the laminated body of the channel underlying layer UC, the channel layer CH and the barrier layer BA via the insulating film IF1 at a density of about $5\times10^{14}$ (5E14) $cm^{-2}$. Implanting energy is, for example, about 120 keV. Incidentally, an implanting condition of the boron ions is adjusted such that a depth of implantation, that is, the bottom, of the element separation, region ISO is located lower than the bottom of the channel underlying layer UC and is located higher than the bottom of the buffer layer BU. The element separation region ISO is formed in this way. A region, surrounded by the element separation region ISO serves as the active region AC. The active region AC surrounded by the element separation region ISO is, for example, almost rectangular as illustrated in FIG. 4. Then, the above-mentioned photoresist film is removed by a plasma stripping process and so forth.

Figure 5:
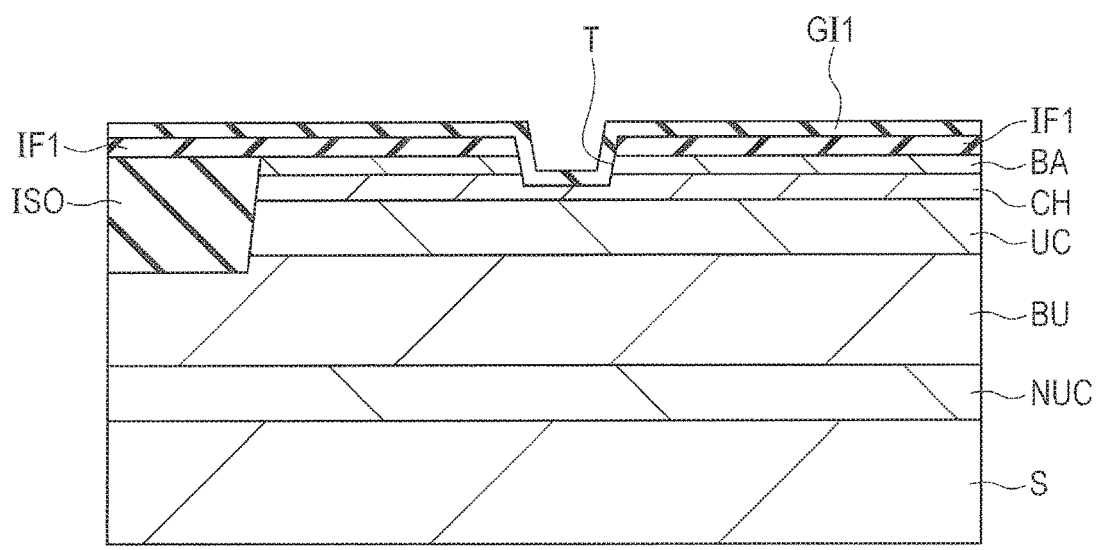
FIG. 5 is a sectional diagram illustrating one example of the manufacturing process of the semiconductor device according to the first embodiment.
Figure 6:
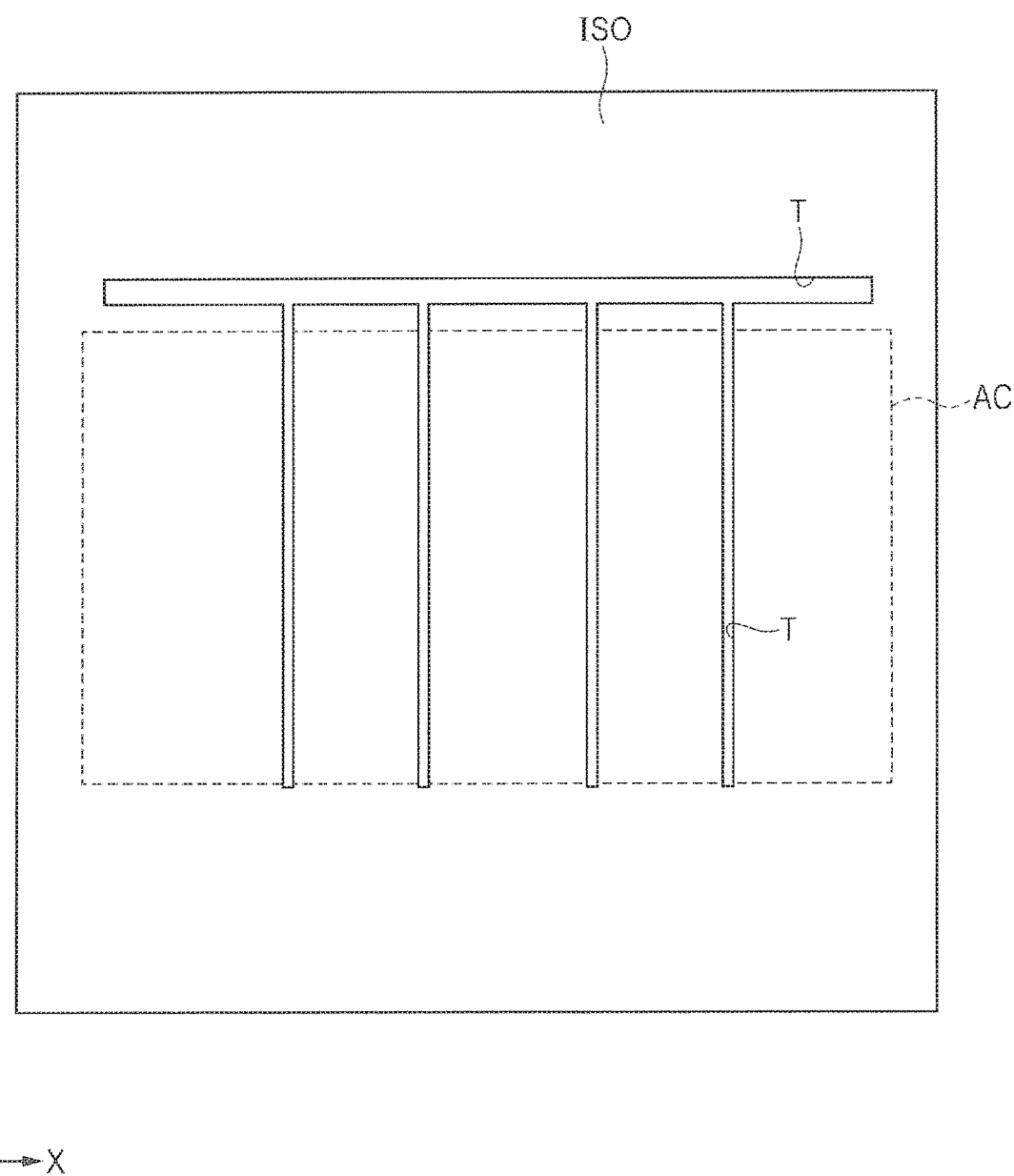
FIG. 6 is a plan view illustrating one example of the manufacturing process of the semiconductor device according to the first embodiment.

Then, as illustrated in FIG. 5 and FIG. 6, the trench T is formed and the gate insulating film (the insulating film) GI1 is formed over the trench T. First, the insulating film IF1 is patterned by using a photolithographic technology and an etching technology. For example, a photoresist film (not illustrated) having an opening in a trench T forming region is formed on the insulating film IF1. Then, the insulating film IF1 is etched by using a photoresist film (not illustrated) as a mask. In a case where the silicon nitride film has been used as the insulating film IF1, dry etching using a fluorine gas such as, for example, $SF_6$ is performed. Then, the photoresist film (not illustrated) is removed by the plasma stripping process and so forth. Such a film forming process is called patterning.

Then, the barrier layer BA and the channel layer CH are dry-etched by using the insulating film IF1 as a mask and thereby the trench T which passes through the barrier layer BA and reaches the middle of the channel layer CH is formed. A chlorine gas such as, for example, $BCl_3$ is used as an etching gas. Then, acid treatment (for example, hydrochloric, acid treatment) is performed on the surface of the trench T.

Then, for example, an aluminum oxide film is deposited on the insulating film IF1 including the inside of the trench T by using an ALD (Atomic Layer Deposition) method and so forth as the gate insulating film GI1 so as to have a film thickness of about 20 nm. Incidentally, the gate insulating film GI1 may be patterned so as to be left only in a desirable region under the gate electrode GE1 which will be described later. The hydrochloric acid gas such as, for example, $BCl_3$ may be used for dray etching.

Figure 7:
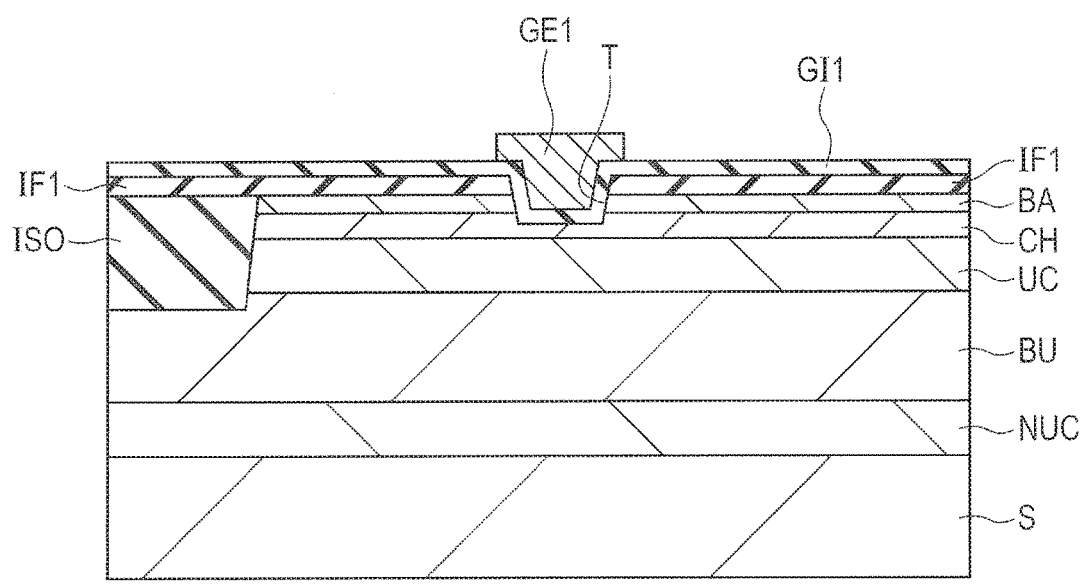
FIG. 7 is a sectional diagram illustrating one example of the manufacturing process of the semiconductor device according to the first embodiment.
Figure 8:
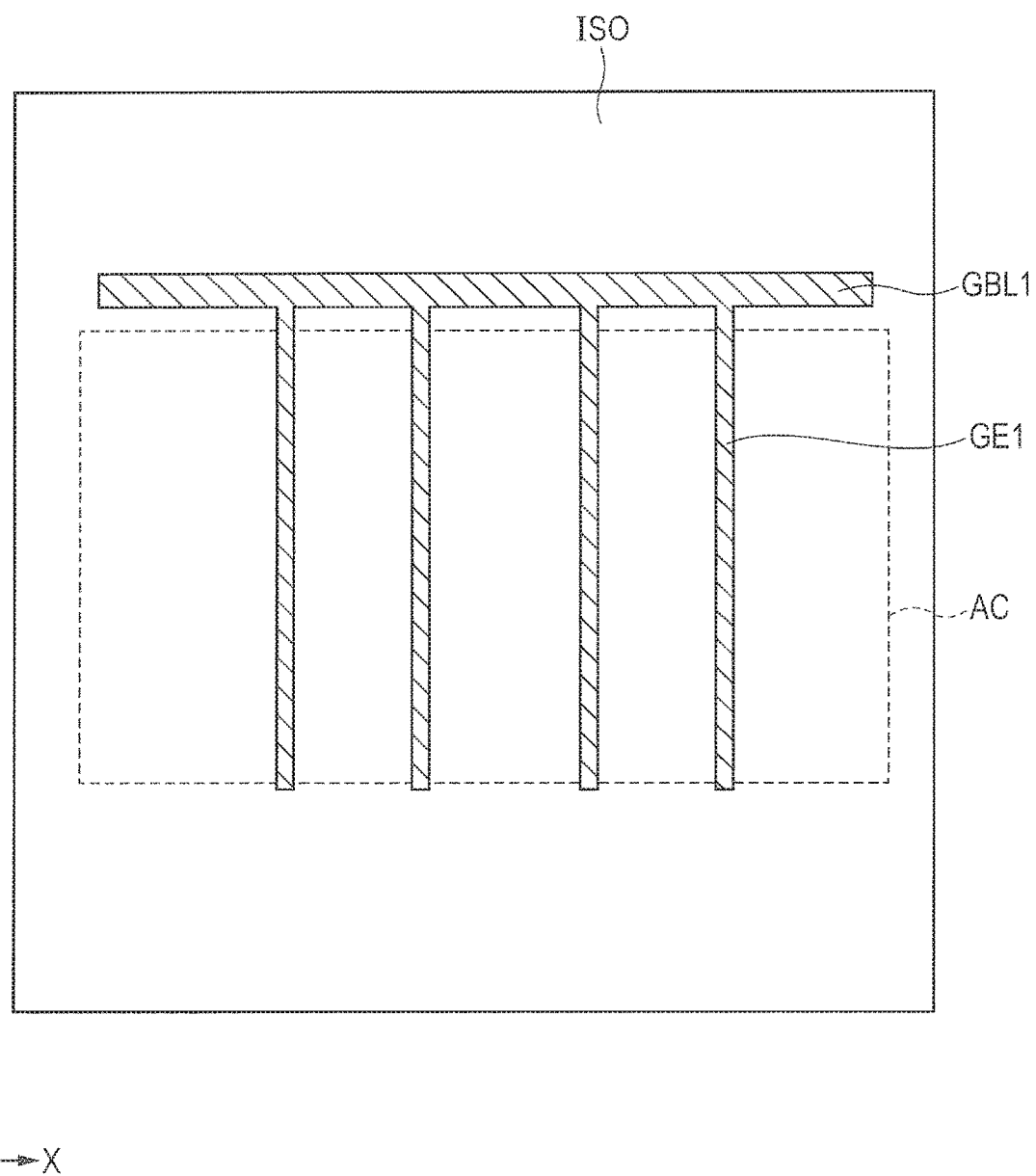
FIG. 8 is a plan view illustrating one example of the manufacturing process of the semiconductor device according to the first embodiment.

Then, as illustrated in FIG. 7 and FIG. 8, the gate electrodes GE1 and the gate bus line GBL1 are formed on the gate insulating film GI1. For example, a TiN (titanium nitride) film is deposited on the gate insulating film GI1 as a conductive film by using a sputtering method and so forth so as to have a film thickness of about 100 nm. Then, a photoresist film (not illustrated) is formed in a region in which the gate electrode and so forth will be formed by using the photolithographic technology, the TiN film is etched by using the photoresist film (not illustrated) as a mask and thereby the gate electrodes GE1 and the gate bus line GBL1 are formed. Dry etching using, for example, the hydrochloric acid gas is performed. Then, the above-mentioned photoresist film is removed by the plasma stripping process and so forth.

Figure 9:
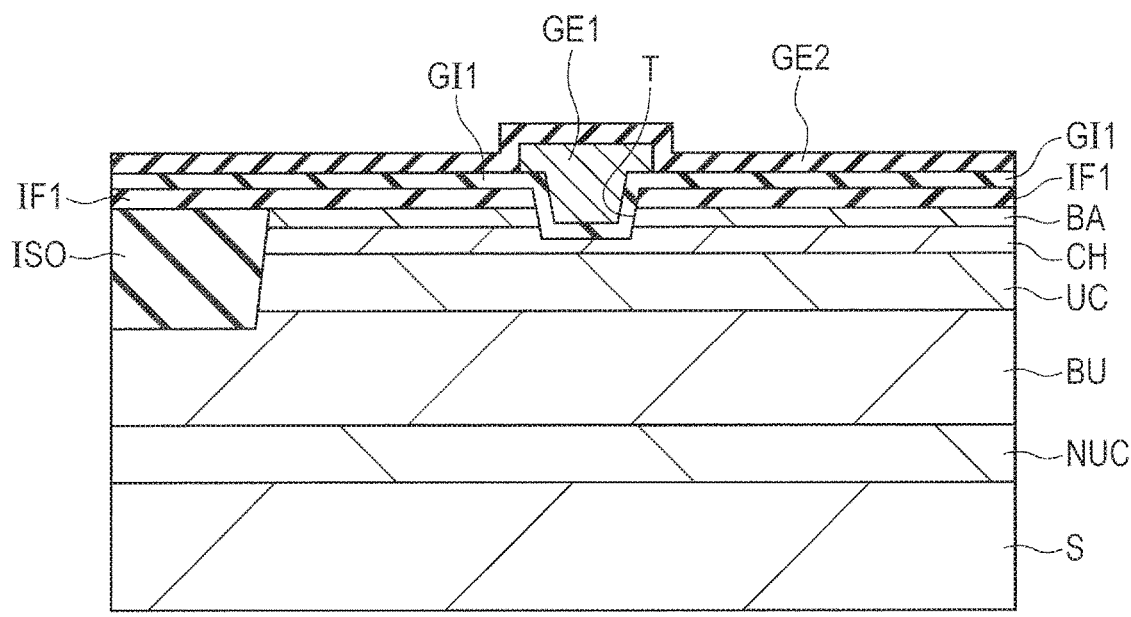
FIG. 9 is a sectional diagram illustrating one example of the manufacturing process of the semiconductor device according to the first embodiment.

Then, as illustrated in FIG. 9, for example, an aluminum oxide film is deposited on the insulating film IF1 and on the gate electrode GE1 (that is, the plurality of gate electrodes and the gate bus line GBL1) as the gate insulating film GI2 by using the ALD method and so forth so as to have a film thickness of about 30 nm. The gate insulating film GI2 serves as a capacitance insulating film of the MIM section MIM. Incidentally, the gate insulating film GI2 may be patterned so as to be left only in a desirable region on the gate electrode GE1 (that is, the plurality of gate electrodes GE1 and the gate bus line GBL1).

Figure 10:
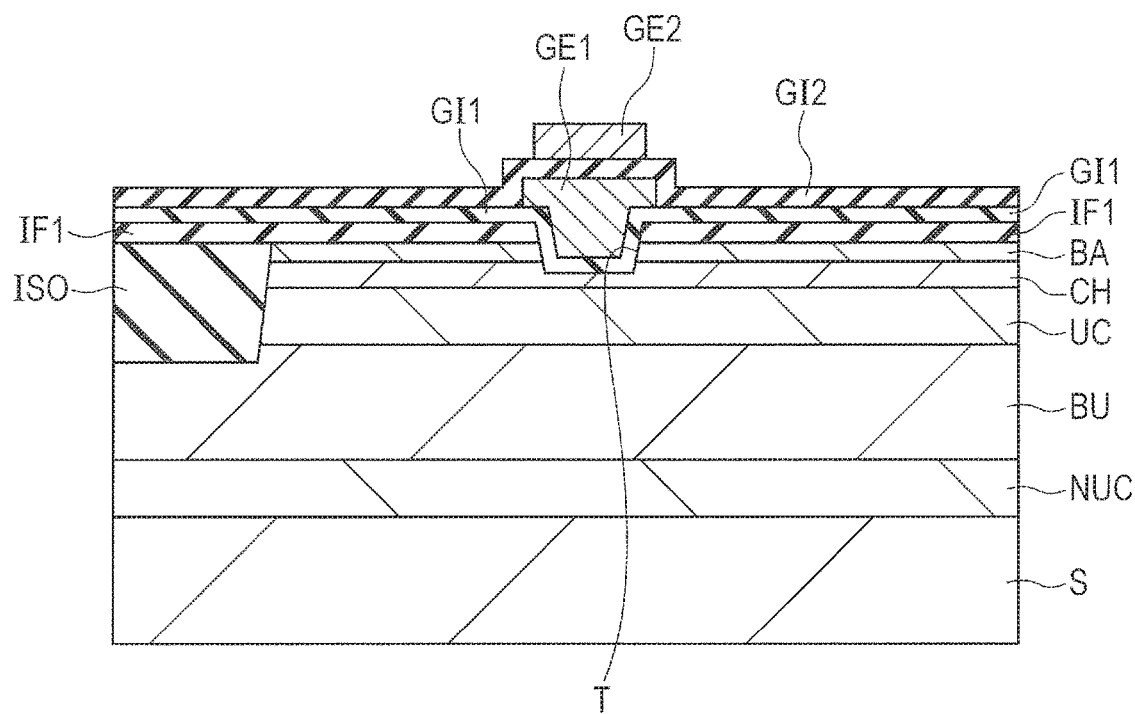
FIG. 10 is a sectional diagram illustrating one example of the manufacturing process of the semiconductor device according to the first embodiment.
Figure 11:
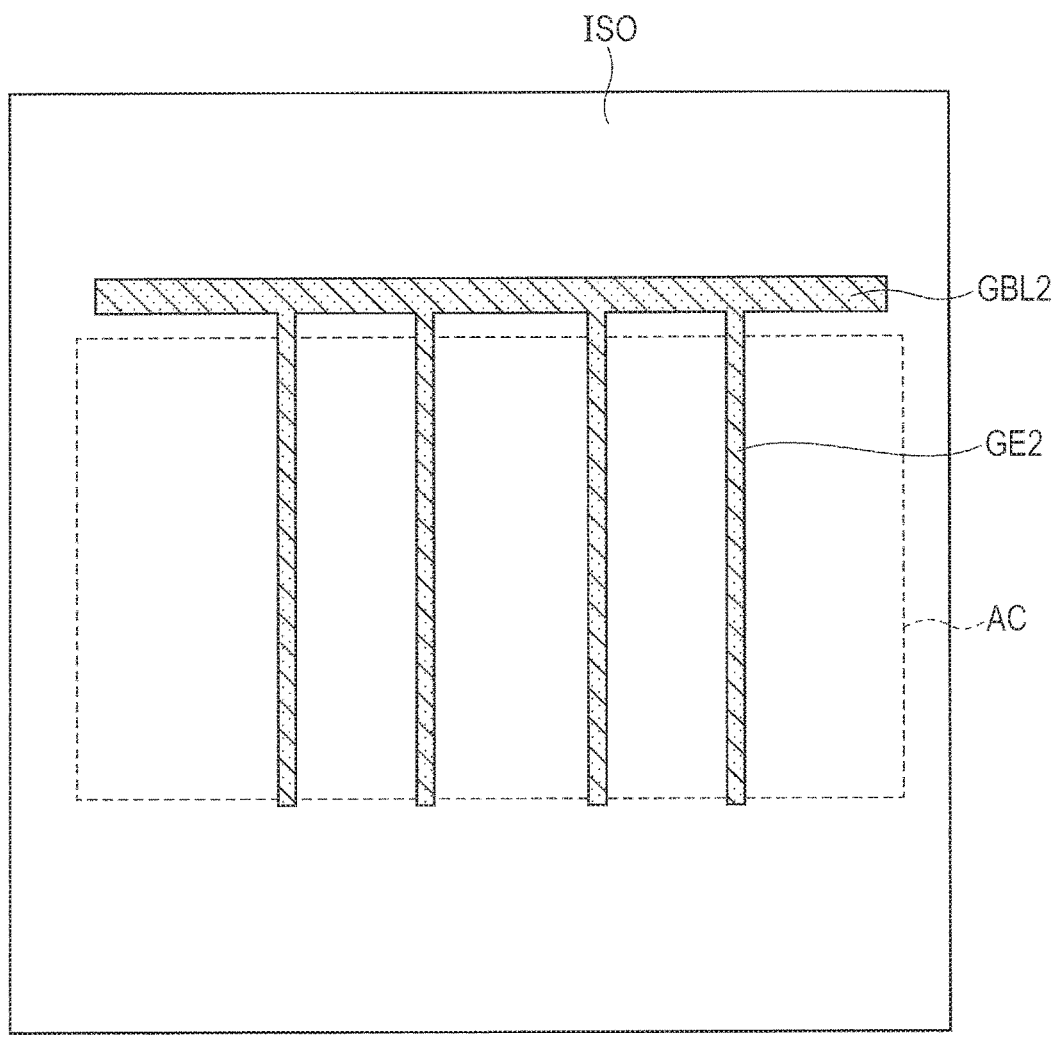
FIG. 11 is a plan view illustrating one example of the manufacturing process of the semiconductor device according to the first embodiment.

Then, as illustrated in FIG. 10 and FIG. 11, the gate electrodes GE2 and the gate bus line GBL2 are formed on the gate insulating film GI2. On this occasion, also the gate pad which is coupled with the gate bus line GBL2 is formed. The gate pad is a wide part which is coupled with the gate bus line GBL2. For example, a TiN (titanium nitride) film is deposited on the gate insulating film GI2 as a conductive film by using the sputtering method and so forth so as to have a film, thickness of about 100 nm. A laminated film of Al/TiN may be used in place of the TiN film. Then, a photoresist film (not illustrated) is formed in a region in which the gate electrodes GE2 and so forth will be formed by using the photolithographic technology, the TiN film is etched by using the photoresist film (not illustrated) as a mask and thereby the gate electrodes GE2, the gate bus line GBL2 and the gate pad are formed. Dry etching using, for example, the hydrochloric acid gas is performed. Then, the above-mentioned photoresist film is removed by the plasma stripping process and so forth.

Incidentally, the respective constituent materials of the gate insulating film GI1, the gate electrode GE1 (that is, the plurality of gate electrodes GE1 and the gate bus line GBL1), the gate insulating film GI2 and the gate electrode GE2 (that is, the plurality of gate electrodes GE2 and the gate bus line GBL2 ) may be sequentially formed and a laminated film configured by the above-mentioned elements may be processed (etched) all at once. Gray regions (dotted regions) in FIG. 11 are an overlapping part of the gate electrode GE1 with the gate electrode GE2 and an overlapping part of the gate bus line GBL1 with the gate bus line GBL2.

Figure 12:
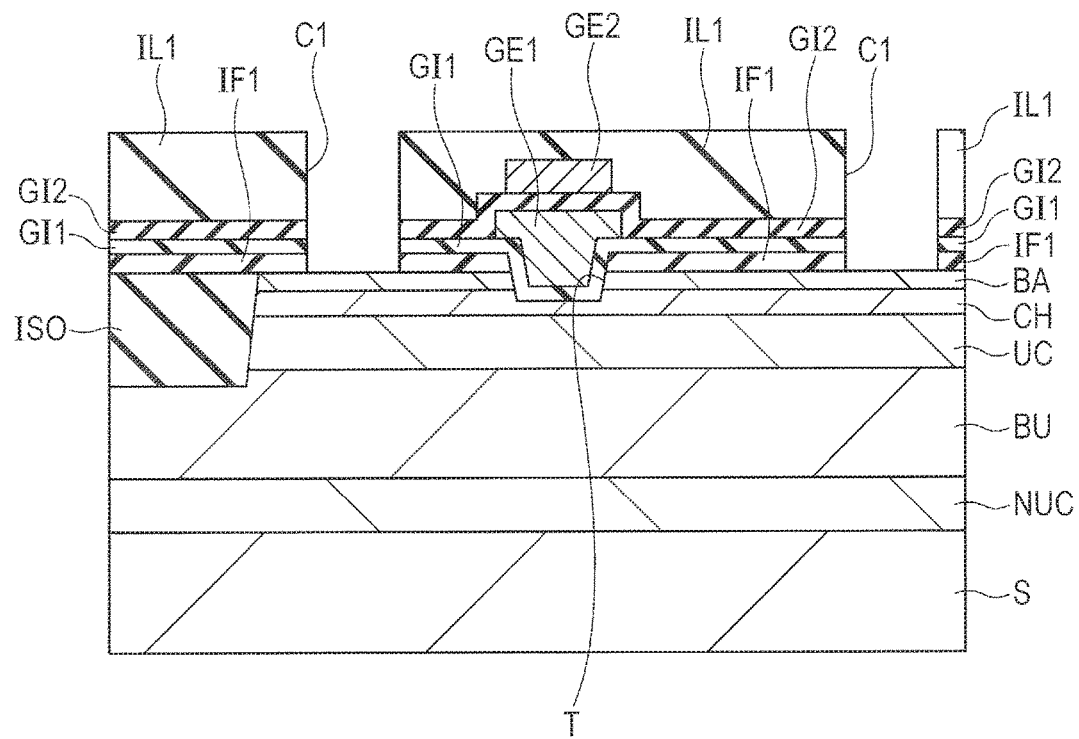
FIG. 12 is a sectional diagram illustrating one example of the manufacturing process of the semiconductor device according to the first embodiment.

Then, as illustrated in FIG. 12, for example, a silicon oxide film is deposited on the gate insulating film GI2 and on the gate electrode GE2 as an interlayer insulating film IL1 by using the PECVD method and so forth so as to have a thickness of about 2000 nm. A so-called TEOS film may be used as the silicon oxide film. The TEOS film is a CVD film using TEOS (Tetra Ethyl Ortho Silicate) as a raw material.

Figure 13:
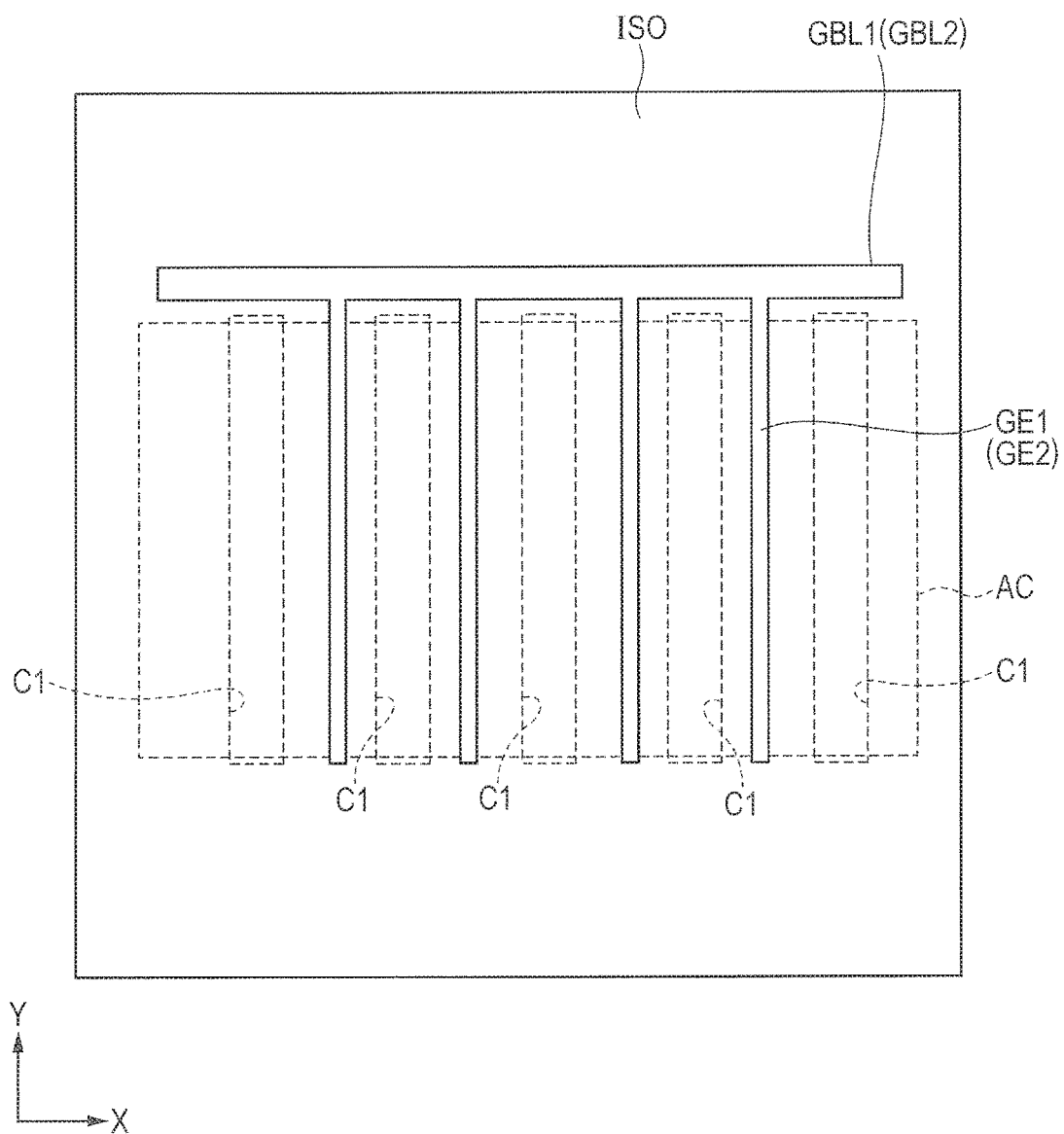
FIG. 13 is a plan view illustrating one example of the manufacturing process of the semiconductor device according to the first embodiment.

Then, as illustrated in FIG. 12 and FIG. 13, the contact holes CI are formed in the interlayer insulating film IL1 and so forth by using the photolithographic technology and the etching technology. For example, dry etching using the fluorine gas is performed. The contact holes CI are formed on the barrier layer BA respectively on the both sides of the gate electrode GE1 (GE2).

Figure 14:
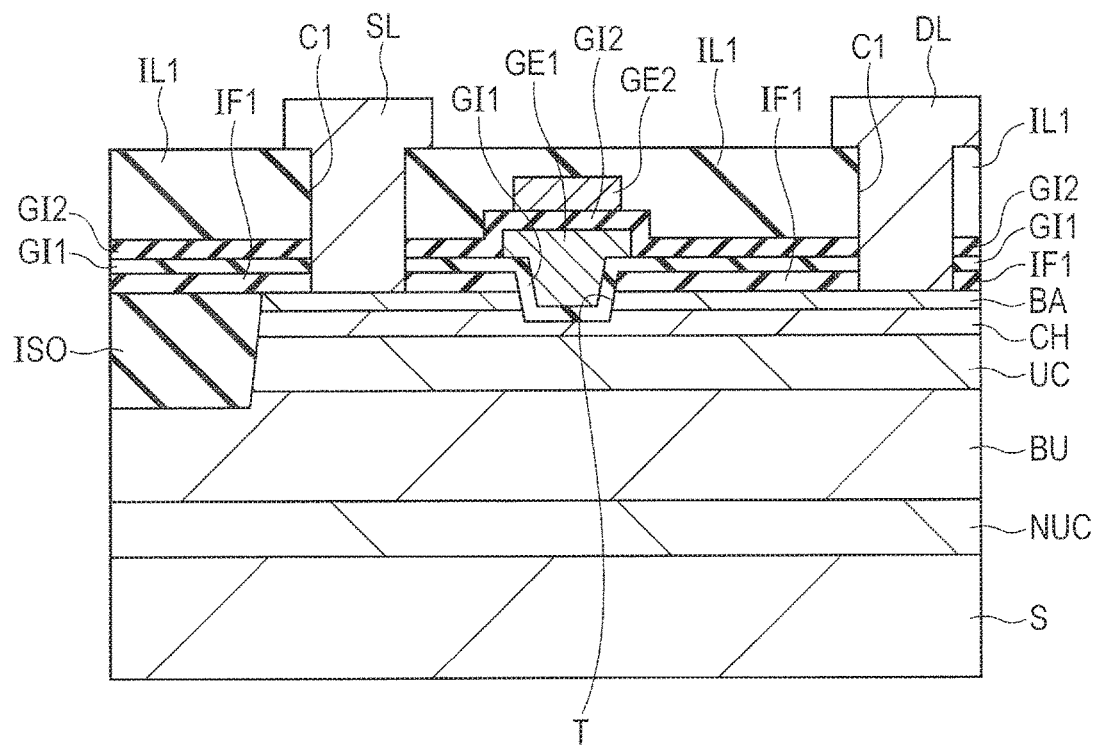
FIG. 14 is a sectional diagram illustrating one example of the manufacturing process of the semiconductor device according to the first embodiment.

Then, as illustrated in FIG. 14, the source line (source wiring) SL and the drain line (drain wiring) DL are formed. On this occasion, the source bus line SBL and the source pad to be coupled thereto, and the drain bus line DBL and the drain pad to be coupled thereto are also formed. The source pad is a wide part to be coupled with the source bus line SBL and the drain pad is a wide part to be coupled with the drain bus line DBL.

For example, a Ti (titanium) film is formed on, for example, the contact holes C1 and the interlayer insulating film IL1 as an underlying metal film by using the sputtering method and so forth. The Ti film has a film thickness of, for example, about 50 nm. Then, an AlCu (an alloy of Al and Cu) film is formed on the underlying metal film as a metal film by using the sputtering method and so forth. The AlCu film has a film thickness of, for example, about 1000 nm. Then, a laminated film of the Ti film and the AlCu film is left in and around the contact holes C1 by using the photolithographic technology and the etching technology. Thereby, it is possible to form, the source line SL and the drain line DL configured, by the laminated films of the underlying metal film and the metal film.

Then, a protection film (not illustrated) is formed on the interlayer insulating film IL1 and on the source line SL and the drain line DL. For example, a silicon oxynitride (SiON) film is deposited on the interlayer insulating film IL1 as the protection film by using the CVD method and so forth. Then, parts of the protection film and so forth are removed by using the photolithographic technology and the etching technology. Specifically, openings are respectively provided in the protection film and so forth on the source pad and the protection film and so forth on the drain pad respectively. Each opening serves as a source pad region (or a drain pad region). In addition, an opening is provided in a protection film and so forth on the gate pad to be coupled with the gate line GL. The opening serves as a gate pad region. Each of the source pad region, the drain pad region and the gate pad region configures a part (an exposed region) of each pad in this way. It is possible to apply a voltage (a signal) to each of the source line SL, the drain line DL and the gate line GL via each opening (each pad region).

It is possible to form the semiconductor device according to the first embodiment by performing the above-mentioned process. Incidentally, the above-mentioned process is one example and the semiconductor device according to the first embodiment may be formed by a process other than the above-mentioned process.

FIRST APPLICATION EXAMPLE

Although, in the above-mentioned first embodiment (FIG. 1 and FIG. 11), the gate electrode GE1 (the plurality of gate electrodes GE1 and the gate bus line GBL1) and the gate electrode GE2 (the plurality of gate electrodes GE2 and the gate bus line GBL2 ) are made similar to each other in shape in planar view, provision of the gate bus line GBL1 may be omitted.

[Description of Structure]

Figure 15:
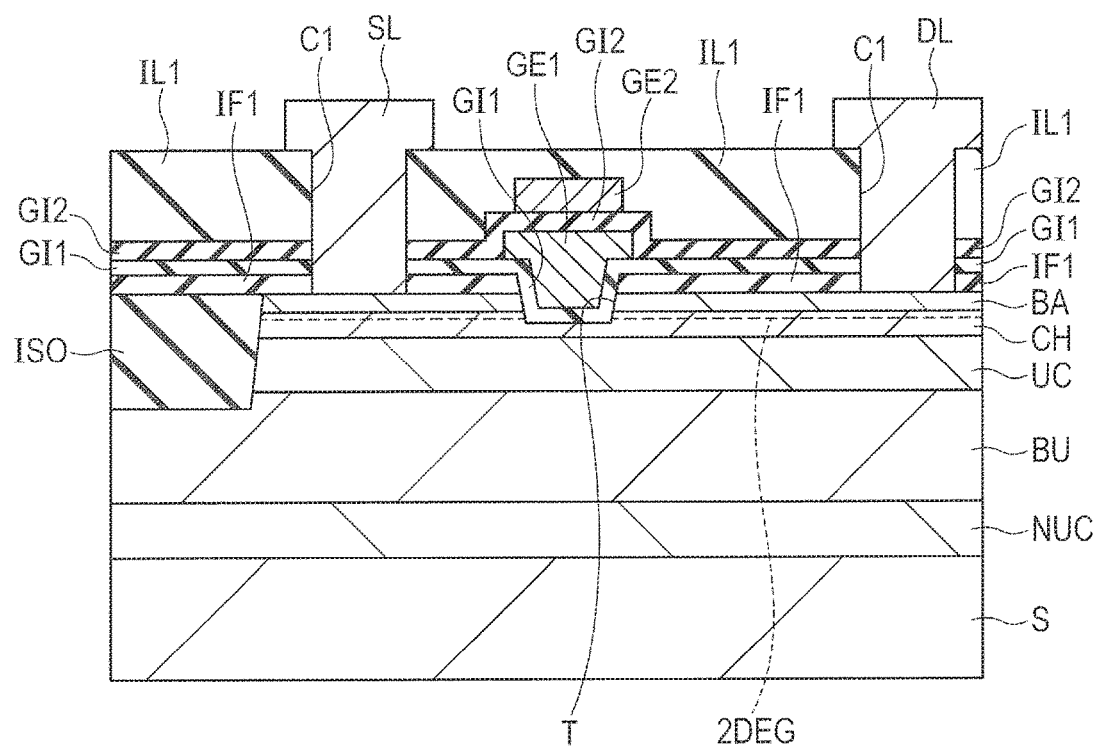
FIG. 15 is a sectional diagram illustrating one example of a configuration of a first application example of the semiconductor device according to the first embodiment of the present invention.
Figure 16:
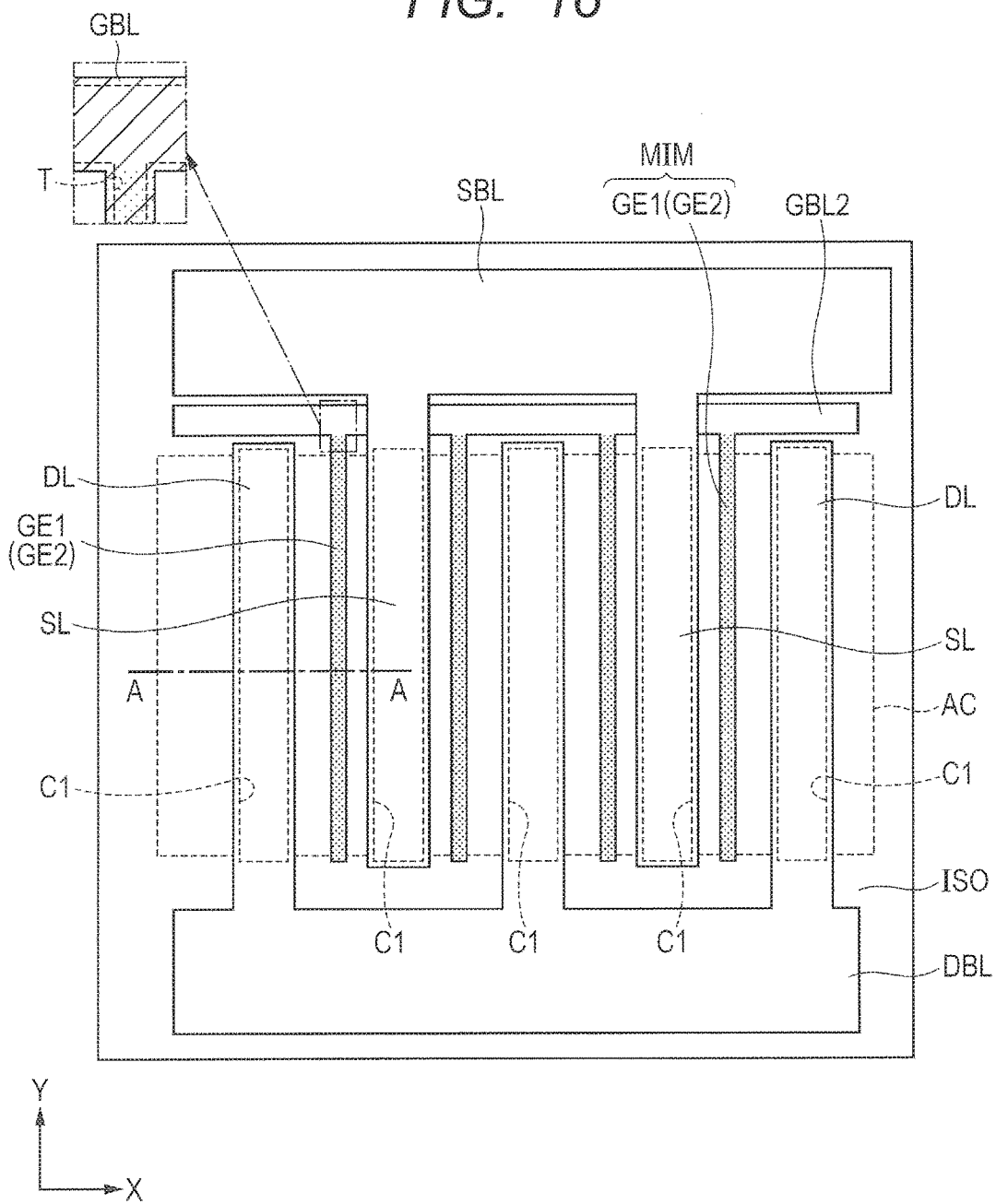
FIG. 16 is a plan view illustrating one example of the configuration of the first application example of the semiconductor device according to the first embodiment of the present invention.

FIG. 15 is a sectional diagram illustrating one example of a configuration of a first application example 1 of the semiconductor device according to the first embodiment. FIG. 16 is a plan view illustrating one example of the configuration of the first application example of the semiconductor device according to the first embodiment. Since configurations other than those of the gate electrodes GE2 and the gate bus line GBL2 are similar to those in the first embodiment, description thereof is omitted. That is, a sectional configuration (FIG. 15) corresponding to an A-A sectional part in FIG. 16 is similar to that of the first embodiment (FIG. 1).

As illustrated in FIG. 16, the plurality of gate electrodes GE2 are coupled together by the gate bus line GBL2. The gate bus line GBL2 is arranged so as to extend in the X-axis direction on the one-end side (on the upper side in FIG. 16) of each gate electrode GE2. In other words, the plurality of gate electrodes GE2 are arranged so as to project from the gate bus line GBL2 which extends in the X-axis direction in the Y-axis direction. Incidentally, the gate bus line GBL2 is coupled with the gate pad region (GP) which is provided, for example, on one side (for example, on the left side in FIG. 2 and see FIG. 20) in the X-axis direction of the gate bus line GBL2.

In addition, in the first application example, the gate bus line (GBL1) which couples together the plurality of gate electrodes GE1 is not provided. Therefore, the plurality of rectangular gate electrodes GE1 each having the long side in the Y-axis direction are arranged.

Then, the plurality of gate electrodes GE1 and the plurality of gate electrode GE2 are similar to each other in shape in planar view. The MIM section (MIM) may be configured by arranging the gate electrodes GE1 so as to face the gate electrodes GE2 via the gate insulating film GI2 in this way. Gray regions in FIG. 16 are overlapping parts of the gate electrodes GE1 with the gate electrodes GE2.

FIRST EXAMPLE

A withstand voltage of the semiconductor device illustrated in FIG. 15 and FIG. 16 is, for example, about 600 V. In addition, in a case where a gate width is about 200 mm and a gate length (a length of a surface of the channel layer) is about 1 μm in the semiconductor device illustrated in FIG.

15 and FIG. 16, a gate capacitance is about 620 pF across the whole chip. In the MIM section MIM which is configured by the gate electrode GE1, the gate insulating film GI2 and the gate electrode GE2, a length in a gate length direction is about 2 μm and a capacitance thereof is about 410 pF across the whole chip.

Here, for example, when a voltage of 10 V is applied to the gate electrode GE2, the voltage is dividedly applied to a gate capacitor (the capacitor configured by the gate electrode GE1, the gate insulating film GI1 and the channel layer CH) and the MIM section MIM which are coupled in series with the gate electrode GE2 and a voltage which has been dividedly applied to the former becomes about 4V and a voltage which has been dividedly applied to the latter becomes about 6 V. A voltage division ratio of the gate capacitor to the MIM section MIM is almost constant not depending on the magnitude of the voltage applied to the gate electrode GE2. Accordingly, in the above-mentioned example, it was confirmed that an electric characteristic that a second gate voltage (Vgs) was increased about 2.5 times is obtained. For example, while a threshold voltage obtained from an Id-Vgs curve was about. 1.2 V (Id=1 mA) in the MISFET, a threshold, voltage of the whole chip was increased to about 3.0 V (Id=1 mA).

Next, the above-mentioned semiconductor device was enclosed into a TO220 package and a switching characteristic thereof was evaluated. An Al wire of about 200 μm in diameter was bonded to each of the gate pad region, the source pad region and the drain pad region so as to be coupled with each of a gate pin, a source pin and a drain pin of the package and the operating characteristic was measured. The semiconductor device was applied to the high side of a back converter circuit and was switched by fixing a duty ratio such that an output voltage becomes about 200 V under conditions of about 400 V in power source voltage and about 10 Ω in gate external resistance. Waveforms of periods of about 11 ns and 8 ns were obtained respectively for a rise time when turning-on and a fall time when turning-off. Then, the semiconductor device was continuously switched in a state of coupling a load of about 1 kW to the above-mentioned circuit and an on-resistance variation was measured (dynamic Ron (On-resistance) measurement). Although Ron was increased, by about 1.0% directly after start of the operation, no noticeable variations were observed in later switching waveform and Ron. It was confirmed that it is possible to maintain a driving state even for a high-voltage and high-current continuous switching operation in the above-mentioned semiconductor device.

In addition, it is possible to change the capacitance of the MIM section MIM in accordance with an area of the overlapping parts of the wiring lines in a structure that the gate bus lines GBL1 and GBL2 mutually overlap as in the semiconductor device illustrated in FIG. 1 and FIG. 11. It is possible to control the voltage division ratio of the gate by changing a ratio of the capacitance of the MIM section MIM to the gate capacitance

[Description of Manufacturing Method]

Figure 17:
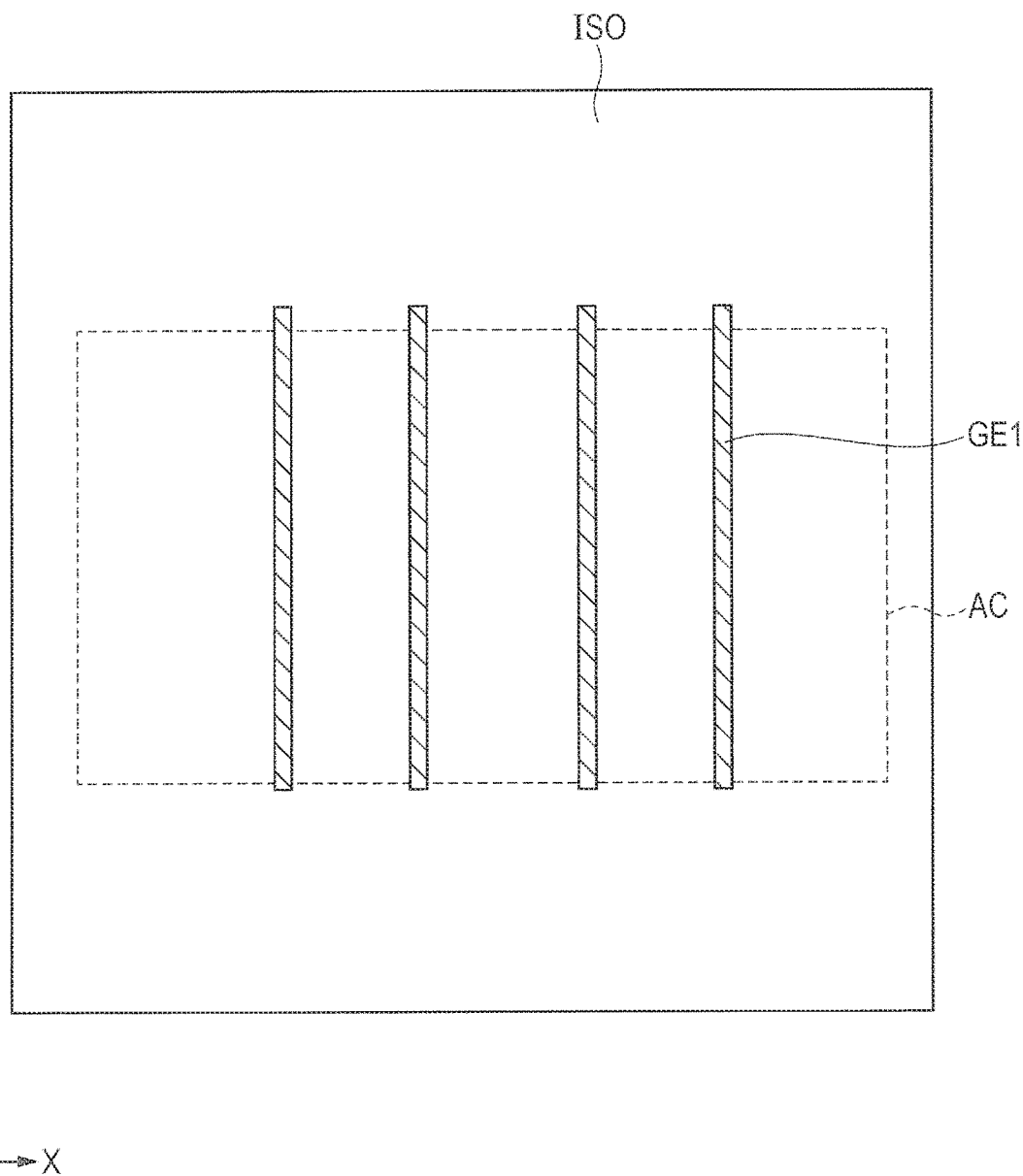
FIG. 17 is a plan view illustrating one example of a manufacturing process of the first application example of the semiconductor device according to the first embodiment.
Figure 18:
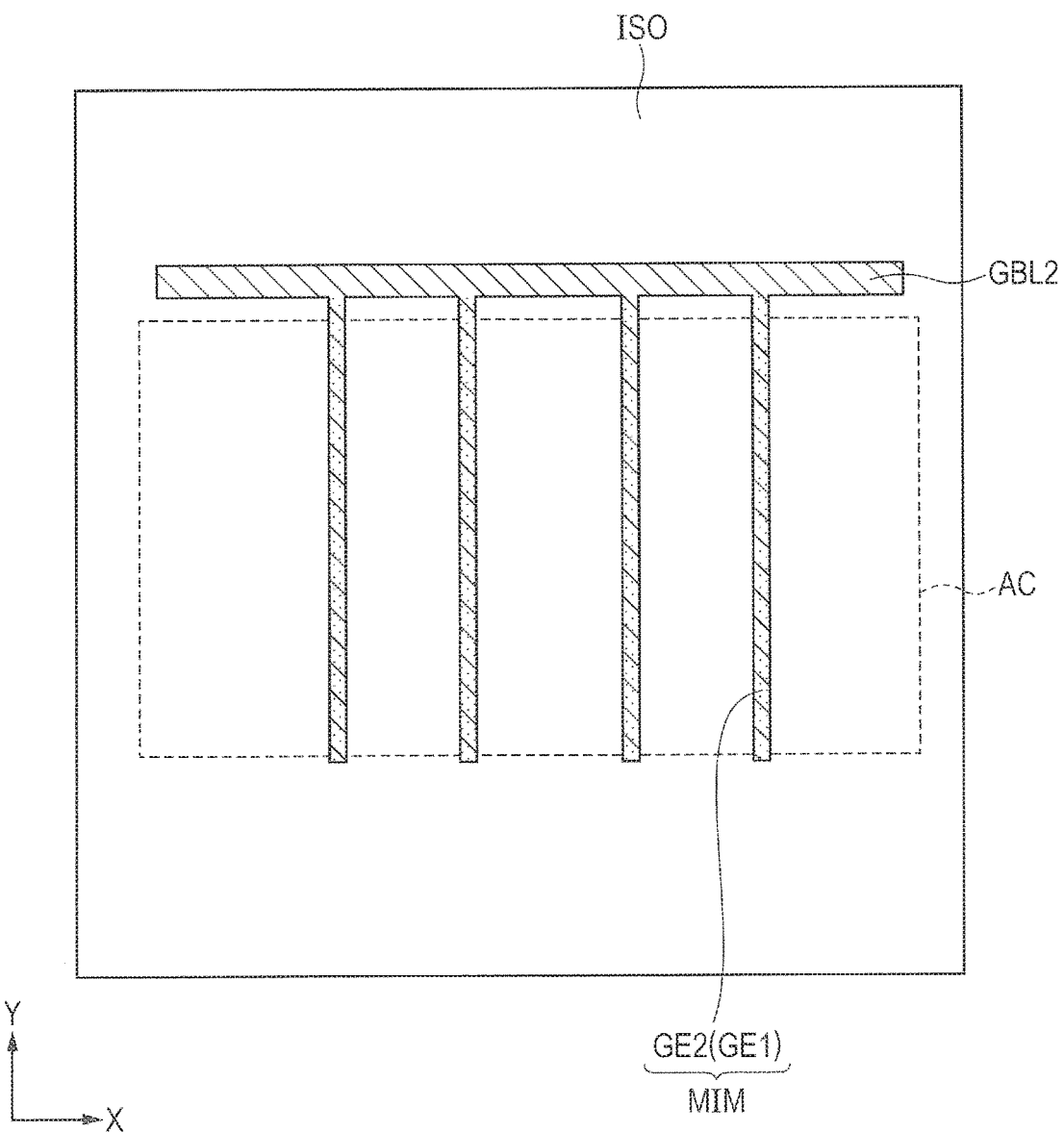
FIG. 18 is a plan view illustrating one example of the manufacturing process of the first application example of the semiconductor device according to the first embodiment.

It is possible to form the semiconductor device of the first application example by a process similar to the manufacturing process of the semiconductor device according to the first embodiment. That is, the semiconductor device of the first application example is different from the semiconductor device according to the first embodiment only in the point that the planar shape of one set of the plurality of gate electrodes GE1 and the gate bus line GBL1 is different from that of the gate electrode GE1 the semiconductor device according to the first embodiment. FIG. 17 and FIG. 18 are plan views illustrating one example of the manufacturing process of the first application example of the semiconductor device according to the first embodiment.

For example, as illustrated in FIG. 17, the gate electrodes GE1 are formed on the gate insulating film GI1. For example, a TiN (titanium nitride) film is deposited on the gate insulating film GI1 as a conductive film by using the sputtering method and so forth so as to have a film thickness of about 100 nm. Then, a photoresist film (not illustrated) is formed in a gate electrode forming region by using the photolithographic technology, the TiN film is etched by using the photoresist film (not illustrated) as a mask and thereby the gate electrodes GE1 are formed. For example, dry etching using the hydrochloric acid gas is performed. Then, the above-mentioned photoresist film is removed by the plasma stripping process and so forth.

Then, after the gate insulating film GI2 has been formed on the insulating film IF1 and on the gate electrode GE1 similarly to the case in the first embodiment, the gate electrodes GE2 and the gate bus line GBL2 are formed on the gate insulating film GE2 as illustrated in FIG. 18. On this occasion, also the gate pad which is coupled with the gate bus line GBL2 is formed. The gate pad is the wide part (a pattern of a comparatively large area) to be coupled with the gate bus line GBL2. For example, a TiN (titanium nitride) film is deposited on, for example, the gate insulating film GI2 as a conductive film by using the sputtering method and so forth so as to have a film thickness of about 100 nm. Then, a photoresist film, (not illustrated) is formed in a gate electrode forming region by using the photolithographic technology, the TiN film is etched by using the photoresist film (not illustrated) as a mask and thereby the gate electrodes GE2 and the gate bus line GBL2 are formed. For example, dry etching using the hydrochloric acid gas is performed. Then, the above-mentioned photoresist film is removed by the plasma stripping process and so forth.

Also in the first application example, it is possible to increase the apparent voltage (the second drive voltage or the second threshold voltage) by providing the MIM section MIM configured by the gate electrode GE1, the gate insulating film GI2 and the gate electrode GE2.

SECOND APPLICATION EXAMPLE

Although in the above-mentioned first embodiment (FIG. 1 and FIG. 11), the MIM configuration is applied to the so-called recessed gate type MISFET that the two-dimensional electron gas (2DEG) is divided by the trench T, the MIM configuration may be also applied to a mesa type MISFET.

[Description of Structure]

Figure 19:
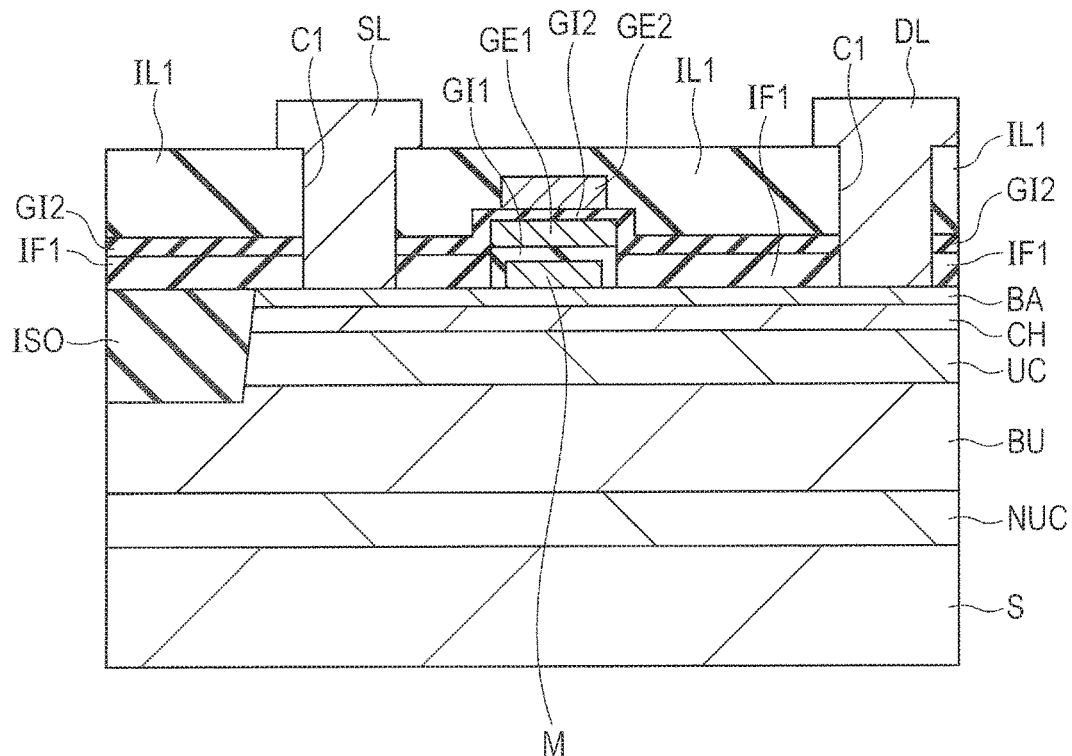
FIG. 19 is a sectional diagram illustrating one example of a configuration of a second application example of the semiconductor device according to the first embodiment.

FIG. 19 is a sectional diagram, illustrating one example of a configuration of a second application example of the semiconductor device according to the first embodiment. The semiconductor device (the semiconductor element) of the second application example illustrated in FIG. 19 is a MISFET using a nitride semiconductor and it is also possible to use the semiconductor device of the second application example as a high electron mobility transistor (HEMT) type power transistor. The semiconductor device of the second application example is the so-called mesa type semiconductor device. Incidentally, the same symbols are assigned to the parts similar to those in the first embodiment and description thereof is omitted.

As illustrated in FIG. 19, in the semiconductor device of the second application example, the nucleation layer NUC, the buffer layer BU, the channel underlying layer UC, the channel layer CH and the barrier layer BA are sequentially formed on the substrate S similarly to the case of the first embodiment. The materials which are similar to those in the first embodiment may be used as the constituent materials of these layers. In addition, as the material of the insulating film IF1 which is formed on the barrier layer BA, the material which is similar to that of the insulating film IF1 in the first embodiment may be used.

Then, the source line SL and the drain line DL are formed on the barrier layer BA. As the constituent materials of the source line SL and the drain line DL, the materials which are similar to those of the source line SL and the drain line DL in the first embodiment may be used. In addition, a mesa section M is formed on the barrier layer BA between the source line SL and the drain line DL. In addition, the gate electrode GE1 is formed on the mesa section via the gate insulating film GI1.

The mesa section M is configured by, for example, a nitride semiconductor layer into which an impurity is not intentionally doped. The mesa section M may be configured as a low concentration n-type or p-type nitride semiconductor layer. All InGaN layer, an AlGaN layer, an InAlN layer, an AlInGaN layer and so forth may be as the mesa section M in addition to the GaN layer. In particular, it is preferable for the mesa section M to select a material or a composition ratio which makes the electron affinity of the mesa section M larger than that of the barrier layer BA. In addition, it is also preferable for the mesa section M to select the material or the composition ratio which makes the electron affinity of the mesa section M equal to that of the channel underlying layer UC, more preferably, to select the material or the composition ratio which makes the electron affinity of the mesa section M larger than that of the channel underlying layer UC. It is possible to improve the characteristic of the normally-off operation by combining the mesa section M with the above-mentioned layers on the basis of the above mentioned conditions.

That is, it is possible to extinguish only electrons (the two-dimensional electron gas) present under the mesa section M by an internal electric action that the constituent material of the mesa section M has. Accordingly, in the semiconductor device of the second application example, it is possible to maintain the off state in a state where the positive voltage (the first threshold voltage) is not applied to the gate electrode GE1 and it is possible to maintain the on state in a state where the positive voltage (the first threshold voltage) is being applied to the gate electrode GE1. It is possible to perform the normally-off operation in this way.

Here, also in the second application example, the gate electrode GE2 is formed on the gate electrode GE1 via the gate insulating film. GI2. That is, the MIM section M configured by the gate electrode GE1, the gate insulating film GI2 and the gate electrode GE2 is provided. Thereby, the MIM section (the capacitor section) is serially coupled with a wiring line and between the gate pad and the gate electrode GE1 to which the drive voltage is applied.

Then, it becomes possible to make the apparent threshold voltage (the second drive voltage or the second threshold voltage) which is applied to the gate electrode GE2 of the MISFET higher than the original threshold voltage (the first drive voltage or the first threshold voltage) which is applied to the gate electrode GE1 in order to form the channel under the gate electrode GE1 similarly to the case of the first embodiment by providing such a MIM section MIM.

[Description of Manufacturing Method]

It is possible to form the semiconductor device of the second application example by a process similar to the manufacturing process in the first embodiment. That is, in the semiconductor device of the second application example, a process of forming the mesa section M is provided in place of the trench forming process in the first embodiment. A method of manufacturing the semiconductor device of the second application example will be described with reference to FIG. 19.

First, the nucleation layer NUC, the buffer layer BA, the channel underlying layer UC, the channel layer CH, the barrier layer BA and the insulating layer IF1 are sequentially formed on the substrate S and thereby the element separation region ISO is formed similarly to the case of the first embodiment. The region surrounded by the element separation region ISO serves as the active region (AC).

Then, the insulating film IF1 in a mesa section M forming region is removed and thereby an opening is formed. The barrier layer BA is exposed from the bottom of this opening. The mesa section M is formed in the opening.

For example, a semiconductor film (an insulated type nitride semiconductor layer) which serves as the mesa section M is formed on the barrier layer BA. For example, a non-doped gallium nitride (an i-type GaN) layer is hetero-epitaxially grown on the barrier BA which is made of, for example, AlGaN by using the MOCVD method and so forth as the semiconductor film. Then, the semiconductor film (the i-type GaN film) is patterned to form the mesa section M.

Then, the insulating film GI1 is formed on the mesa section M similarly to the first embodiment. For example, an aluminum oxide film is deposited as the insulating film GI1 on, for example, the insulating film IF1 and the mesa section M by using the ALD method and so forth so as to have a film thickness of about 20 nm. Then, the insulating film GI1 is patterned so as to be left on the mesa section M.

Then, the gate electrodes GE1 and the gate bus line GBL1 are formed on the insulating film GI1. It is possible to form the gate electrodes GI1 and the gate bus line GBL1 similarly to the first embodiment.

Then, the gate insulating film GI2 is formed on the insulating film IF1 and on the gate electrode GE1 (the plurality of gate electrodes GE1 and the gate bus line GBL1) and then the gate electrodes GE2 and the gate bus line GBL2 are formed similarly to the first embodiment. For example, the gate electrode GE1 (the plurality of gate electrodes GE1 and the gate bus line GBL1) and the gate electrode GE2 (the plurality of gate electrodes GE2 and the gate bus line GBL2 and the same is true of the following) have pectinate shapes and are formed so as to mutually overlap (see FIG. 8 and FIG. 11).

Then, the interlayer insulating film IL1, the source line SL and the drain DL are formed similarly to the first embodiment. Further, a protection film (not illustrated) is formed and the pad region id formed by providing an opening in a desirable region.

It is possible to form the semiconductor device of the second application example by the above-mentioned process. Incidentally, the above-mentioned process is merely one example and the semiconductor device of the second application example may be formed by a process other than the above-mentioned process.

As described above, there exist, the recessed gate type MISFET and the mesa type MISFET as the configurations for partially extinguishing the two-dimensional electron gas and it is possible to apply the MIM configuration of the second application example to both of the recessed gate type MISFET and the mesa type MISFET, Incidentally, in the second application, example, the gate electrode GE1 may be formed into the shape in the first application example (see FIG. 17 and FIG. 18).

Second Embodiment

Although the MIM section is formed in the active region (see FIG. 16 and FIG. 18) in the first application example of the first embodiment, the MIM section may be formed in the element separation region.

[Description of Structure]

Figure 21:
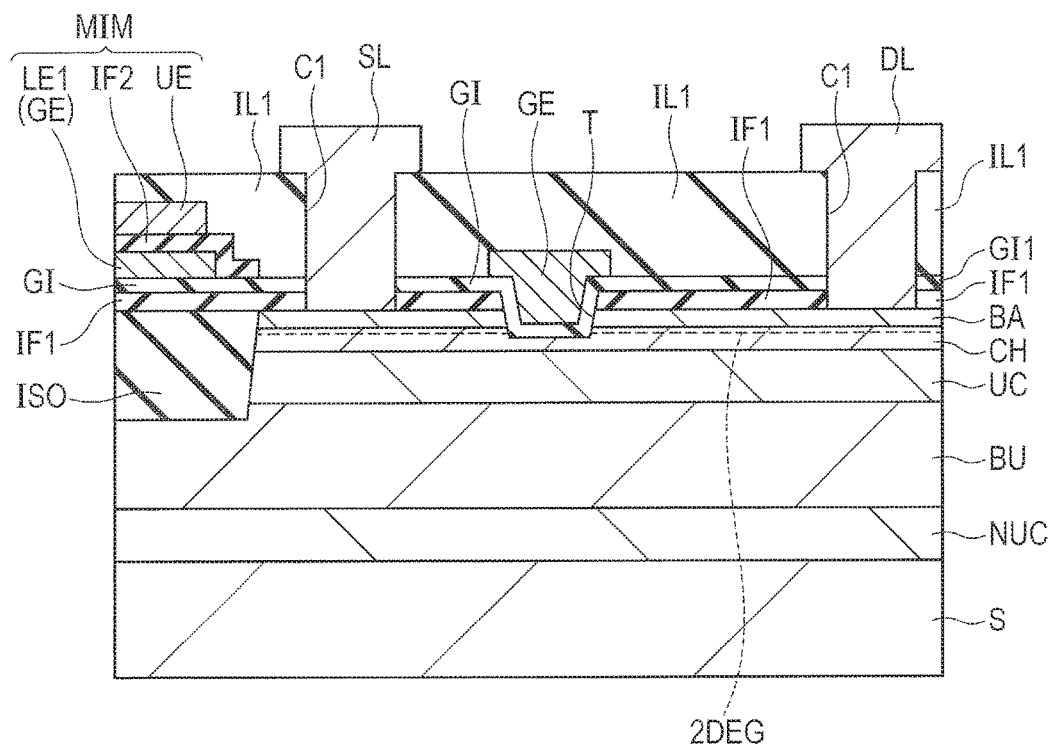
FIG. 21 is a sectional diagram illustrating one example of the configuration of the semiconductor device according to the second embodiment.
Figure 22:
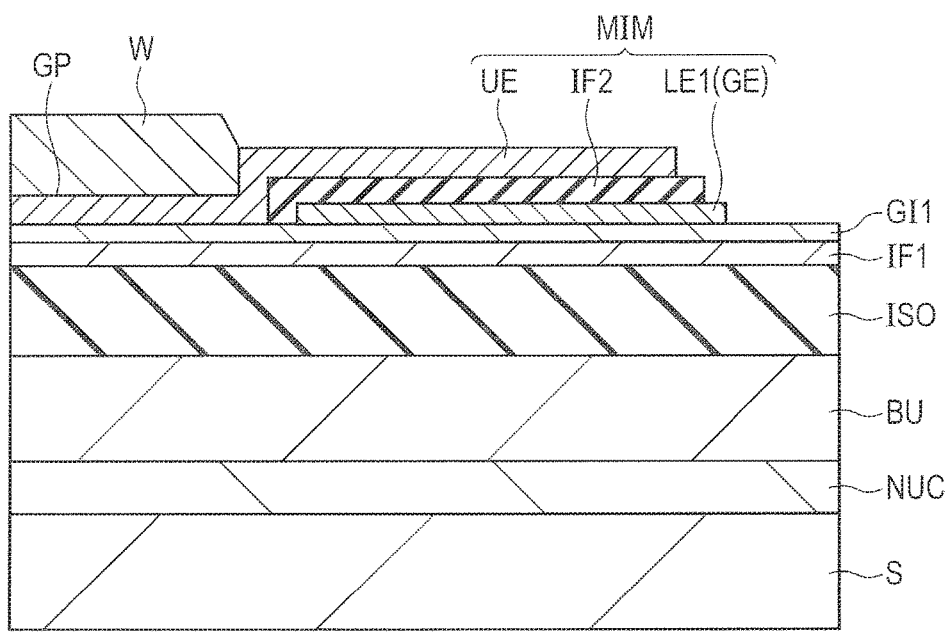
FIG. 22 is a sectional diagram illustrating one example of the configuration of the semiconductor device according to the second embodiment.

FIG. 20 is a plan view illustrating one example of a configuration of a semiconductor device according to a second embodiment. FIG. 21 and FIG. 22 each is a sectional diagram illustrating one example of the configuration of the semiconductor device according to the second embodiment. FIG. 21 corresponds to, for example, an A-A sectional part in FIG. 20 and FIG. 22 corresponds to, for example, a B-B sectional part in FIG. 20. The semiconductor device according to the second embodiment is a recessed gate type semiconductor device. Incidentally, the same symbols are assigned to parts similar to those in the first embodiment and description thereof is omitted.

In the second embodiment, as illustrated in FIG. 20, the MIM section (MIM) is provided in the vicinity of the gate pad region GP (also called a gate lead-out section) on one side (the left side in FIG. 20) in the X-axis direction of the gate bus line GBL. The second embodiment is different from, the first embodiment in this point.

In FIG. 20, the semiconductor device according to the second embodiment includes two upper and lower transistor units (an upper pectinate section and a lower pectinate section) which are equipped with the MIM sections MIM respectively. The first MIM section MIM is configured by a lower electrode LE1, an insulating film IF2 and an upper electrode UE. The lower electrode LE1 is configured by the film which is in the same layer as the gate electrode GE. The second MIM section MIM is configured by a lower electrode LE2, the insulating film IF2 and the upper electrode UE. The lower electrode LE2 is configured by the film which is in the same layer as the gate electrode GE. Incidentally, since the two MIM sections MIM are similar to each other in configuration, here, the MIM section MIM including the lower electrode LE1 will be mainly described.

Then, in the second embodiment, the gate insulating film (GI2) and the gate electrode (GE2) are not formed on a gate electrode GE as illustrated in FIG. 21. The second embodiment is different from the first embodiment also in this point.

As illustrated in FIG. 21, in the semiconductor device according to the second embodiment, the nucleation layer NUC, the buffer layer BU, the channel underlying layer UC, the channel layer CH and the barrier layer BA are sequentially formed on the substrate S similarly to the case of the first embodiment. Materials which are similar to those used in the first embodiment may be as the constituent materials of these layers. In addition, a material which is similar to that in the first embodiment may be used as the constituent material of the insulating film IF1 formed on the barrier layer BA.

In addition, a MISFET according to the second embodiment includes the gate electrode GE which is formed over the channel layer CH via a gate insulating film GI. Then, the MISFET also includes the source line SL and the drain line DL which are formed on the barrier layer BA respectively on the both sides of the gate electrode GE. In addition, materials which are similar to those in the first embodiment may be used as the constituent materials of the gate insulating film GI, the gate electrode GE, the source line SL and the drain line DL.

The MISFET is formed in the active region (AC) which is partitioned by the element separation region ISO. In addition, the gate electrode GE is formed in the trench (also called the recess) T which passes through the barrier layer BA and reaches the middle of the channel layer CH via the gate insulating film GI.

Here, in the second embodiment, the MIM section (MIM) is provided on the element separation region ISO which is arranged adjacent to the active region AC. As illustrated on the left part of FIG. 21 and in FIG. 22, the MIM section MIM is configured by the lower electrode LE1, the insulating film IF2 formed on the lower electrode LE1 and the upper electrode UE formed on the insulating film IF2. The lower electrode LE1 is configured by, for example, a film which is in the same layer as the gate electrode GE. That is, the lower electrode LE1 is coupled with each gate electrode GE via a gate bus line GBL (see FIG. 20 and FIG. 23). Incidentally, the gate insulating film GI and the insulating film IF1 may be left unremoved between the element separation region ISO and the lower electrode LE1. The gate pad region GP is provided on the upper electrode UE (see FIG. 22). The lower electrode LE1, the gate bus line GBL and the gate electrode GE are not coupled with the gate pad region GP. That is, the drive voltage is applied to the upper electrode UE via the gate pad region GP. On the other hand, the lower electrode LE1, the gate bus line GBL and the gate electrode GE are electrically separated from the upper electrode UE by the insulating film IF2. The lower electrode LE1, the gate bus line GBL and the gate electrode GE are in the floating states.

It becomes possible to make the apparent threshold voltage (the second drive voltage or the second threshold voltage) which is applied to the upper electrode US higher than the original threshold voltage (the first drive voltage or the first threshold voltage) which is applied to the gate electrode GE in order to form the channel under the gate electrode GE similarly to the case of the first embodiment by providing the above-mentioned MI>M section (the lower electrode LE1, the insulating film IF2 and the upper electrode UE).

[Description of Manufacturing Method]

Figure 23:
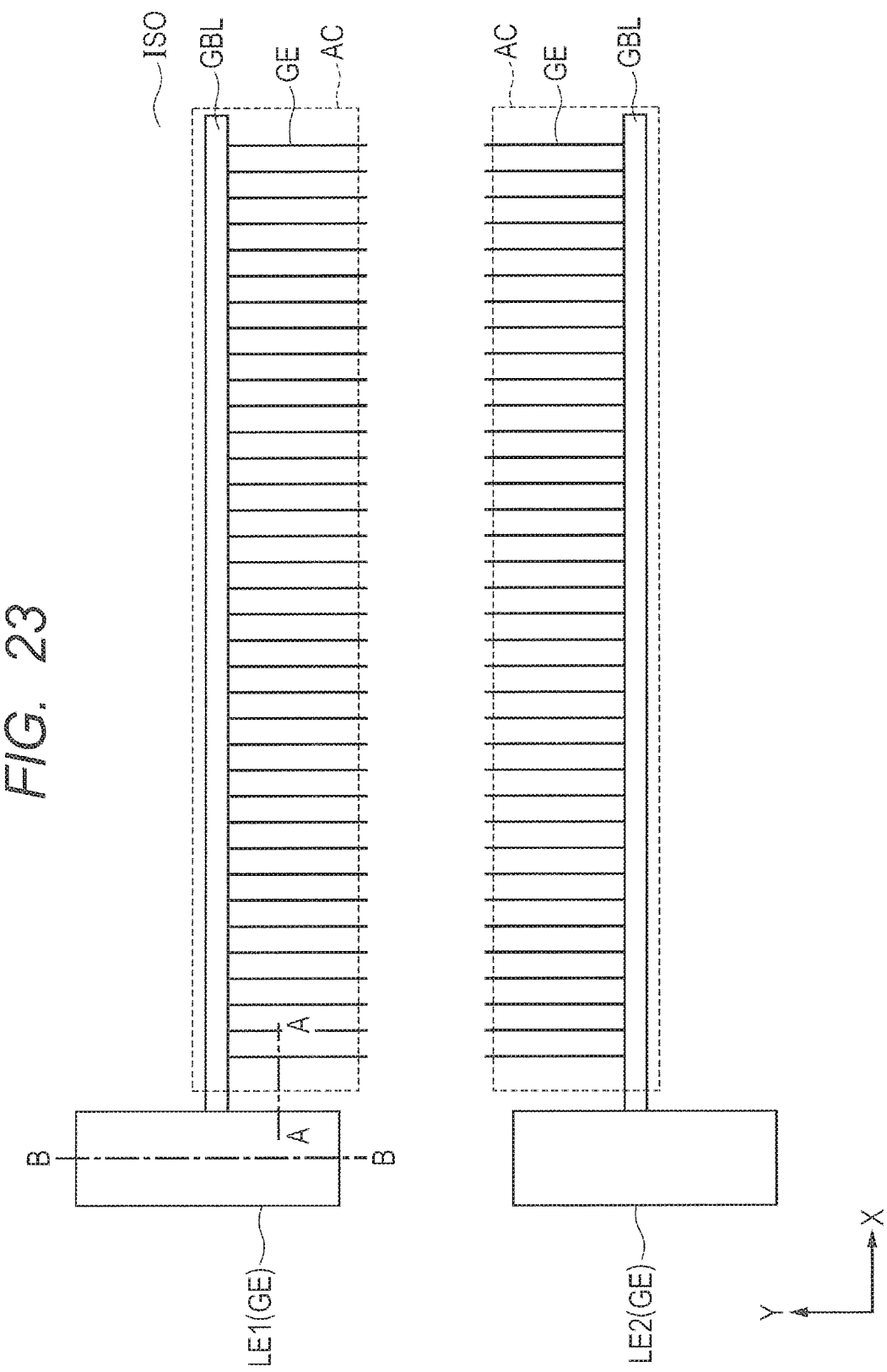
FIG. 23 is a plan view illustrating one example of a manufacturing process of the semiconductor device according to the second embodiment.
Figure 24:
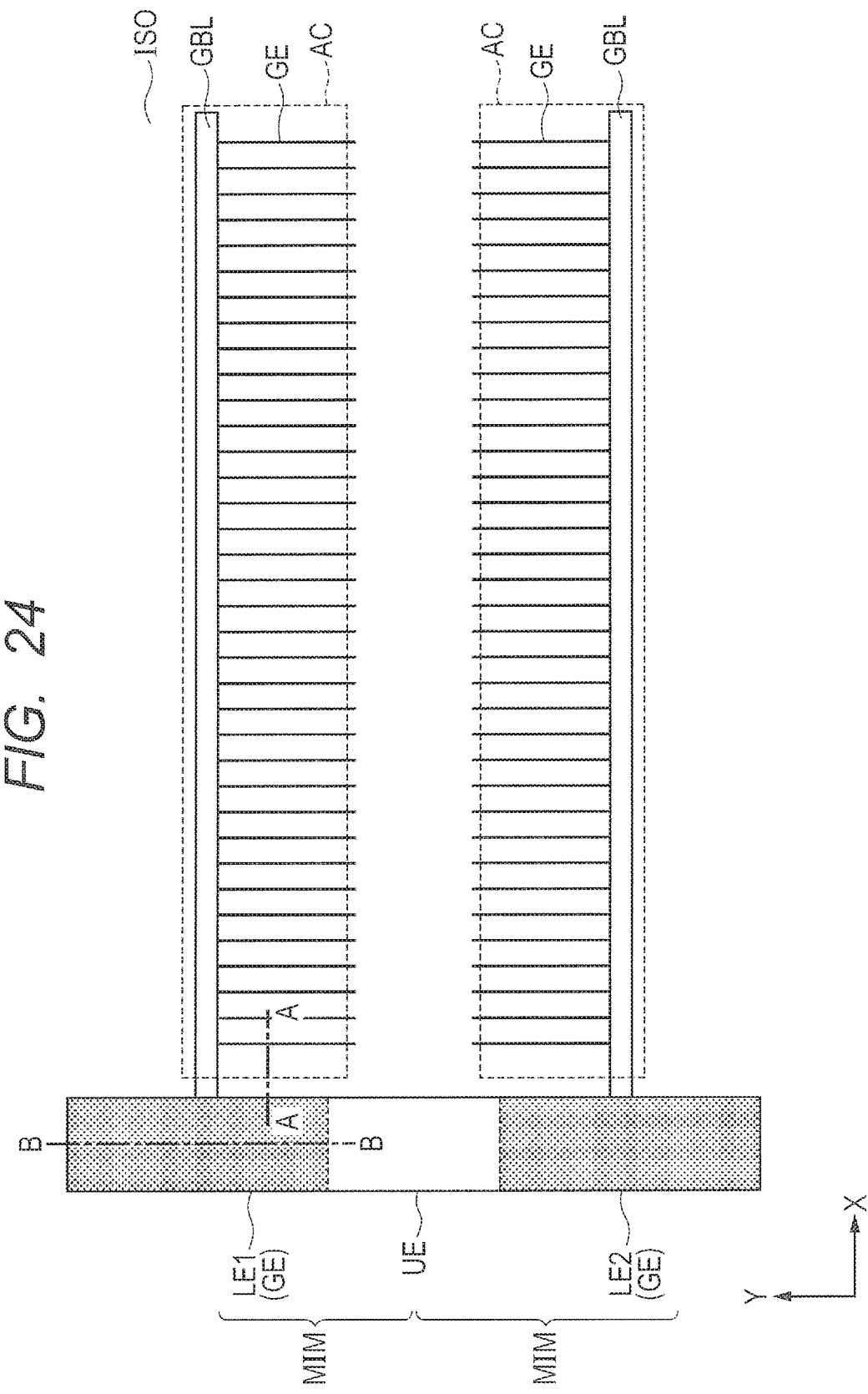
FIG. 24 is a plan view illustrating one example of the manufacturing process of the semiconductor device according to the second embodiment.

It is possible to form the semiconductor device according to the second embodiment by a process similar to the manufacturing process in the first embodiment. FIG. 23 and FIG. 24 each is a plan view illustrating one example of a manufacturing process of the semiconductor device according to the second embodiment.

First, the nucleation layer NUC, the buffer layer BA, the channel underlying layer CH, the channel layer CH, the barrier layer BA and the insulating film IF1 are sequentially formed on the substrate S similarly to the case of the first embodiment (see FIG. 21, FIG. 3 and FIG. 4). Then, the trench T is formed similarly to the first embodiment and the gate insulating film GI is formed over the trench T (FIG. 21).

Then, the gate electrode GE and so forth are formed similarly to the first embodiment. On this occasion, as illustrated in FIG. 23, the lower electrode LE1 is coupled with the gate electrode GE via the gate bus line GBL. One conductive film is patterned in this way.

Then, the insulating film IF2 is formed on the gate electrode GE, the gate bus line GBL and the lower electrode LE1, then another conductive film is formed on the insulating film IF2 and the upper electrode UE is formed by patterning the conductive film (see FIG. 24). Gray regions (dotted regions) in FIG. 24 are overlapping parts of the lower electrode LE1 with the upper electrode UE and of the lower electrode LE2 with the upper electrode It is possible to form the two MIM sections (MIM) each being configured by the lower electrode (LE1 or LE2), the insulating film IF2 and the upper electrode UE in this way. One of the MIM sections MIM which is configured by the lower electrode IE1, the insulating film IF2 and the upper electrode UE is coupled between the gate pad region GP and the gate bus line GBL illustrated on the upper side in FIG. 24 and the other MIM section MIM which is configured by the lower electrode LE2, the insulating film IF2 and the upper electrode UE is coupled between the gate pad region GP (an Al wire W) and the gate bus line GBL illustrated on the lower side in FIG. 24.

Then, the interlayer insulating film IL1, the source line SL, the drain line DL and so forth are formed. It is possible to form the above-mentioned parts similarly to the first embodiment. Then, a protection film (not illustrated) is formed and the insulating films (the protection film and so forth) formed on the gate pad and so forth coupled with the gate bus line GBL are removed. A part formed by removing the insulating films serves as the gate pad region GP. Then, the Al wire (an Al electrode and a pad electrode) W is bonded into the gate pad region GP (see FIG. 20 to FIG. 22).

SECOND EXAMPLE

A withstand voltage of the semiconductor device illustrated in FIG. 20 to FIG. 22 is, for example, about 600 V. In addition, in the semiconductor device illustrated in FIG. 20 to FIG. 22, a total extension of a gate width of each of the two upper and lower transistor units (the upper pectinate part and the lower pectinate part) in FIG. 20 is about 200 mm and the gate width is about 1 μm. An area of one MIM section MIM illustrated in FIG. 20 is determined by the overlapping parts of the upper electrode UE with the lower electrode LE1 and, for example, its length is about 500 μm and its width is about 200 μm.

A gate capacitance for one transistor unit is about 310 pF and a capacitance of the MIM section which is coupled in series with this transistor unit is about 210 pF. The semiconductor device is designed such that a voltage division ratio of the transistor to the MIM section MIM becomes almost 2:3. When the Id-Vgs characteristic and the Cg-Vgs characteristic were measured by using the above-mentioned semiconductor device, a waveform which was enlarged about 2.5 times in the Vgs direction was obtained in each of the characteristics and it was confirmed that the designed voltage division ratio (about 2:3) is realized.

Incidentally, the second embodiment may be applied to the mesa type semiconductor device (see FIG. 19). That is, the mesa type semiconductor device (provision of the gate electrodes GE2 and the gate insulating film GI2 in the semiconductor device in FIG. 19 is omitted) may be applied in place of the recessed gate type semiconductor device (FIG. 21).

Third Embodiment

Although, in the second embodiment, the lower electrode of the MIM section MIM is configured by the film which is in the same layer as the gate electrode GE, the two-dimensional electron gas (2DEG) may be utilized as a lower-layer electrode of the MIM section MIM.

[Description of Structure]

Figure 25:
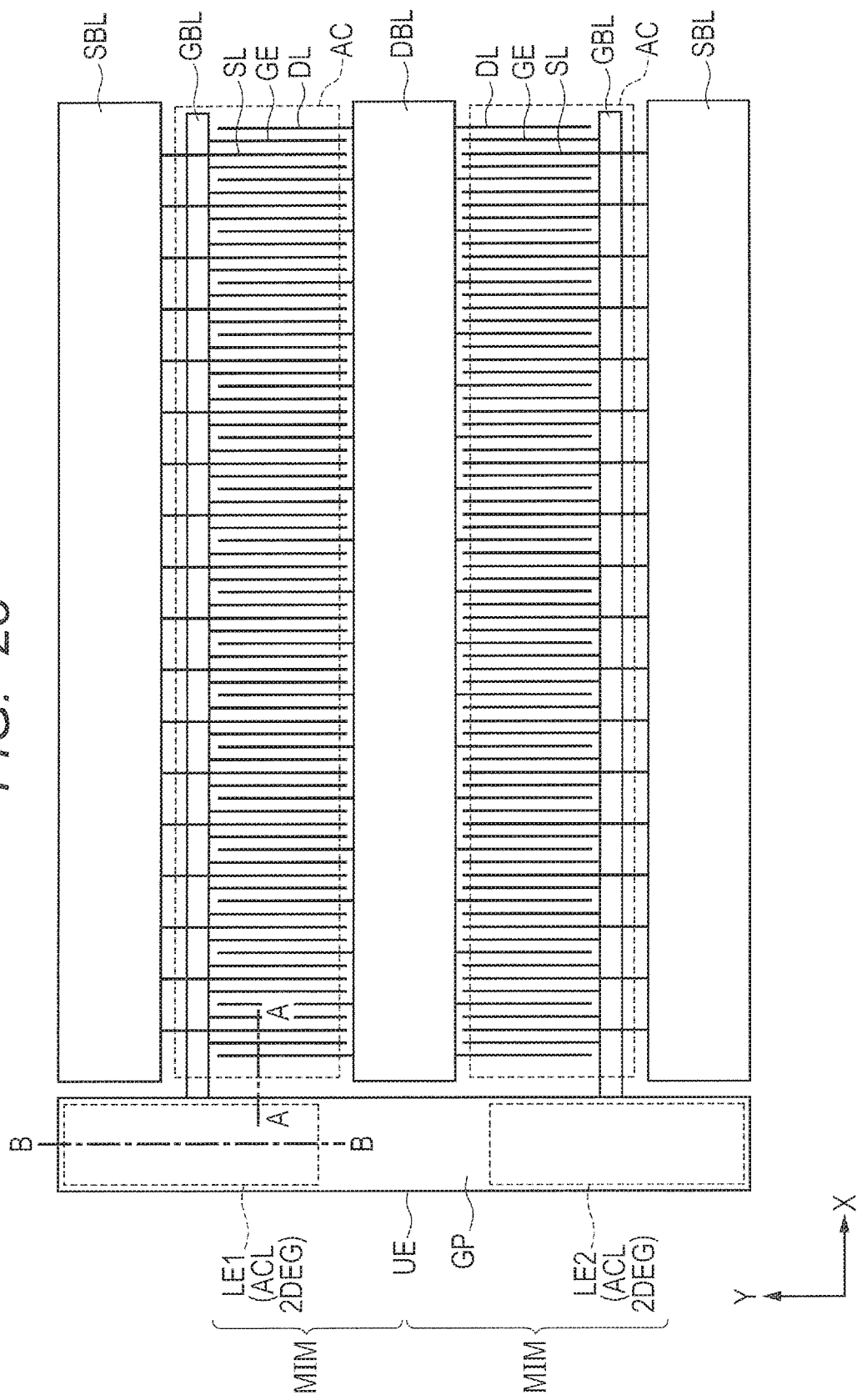
FIG. 25 is a plan view illustrating one example of a configuration of a semiconductor device according to a third embodiment.
Figure 26:
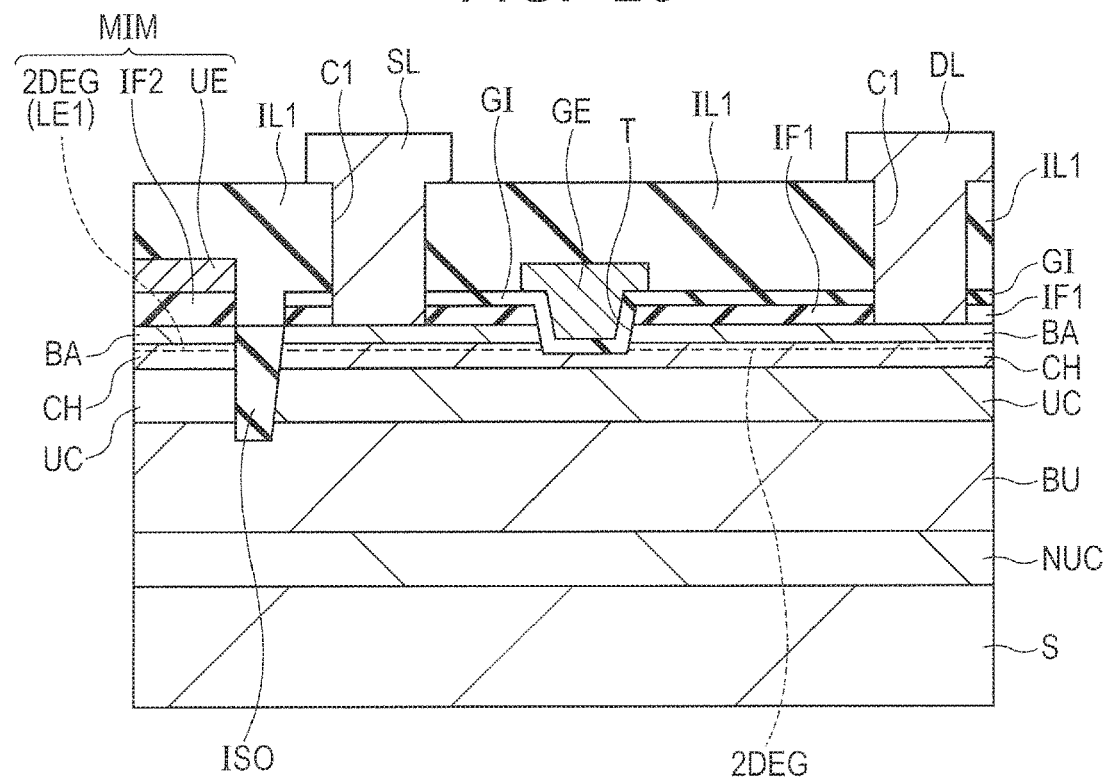
FIG. 26 is a sectional diagram illustrating one example of the configuration of the semiconductor device according to the third embodiment.
Figure 27:
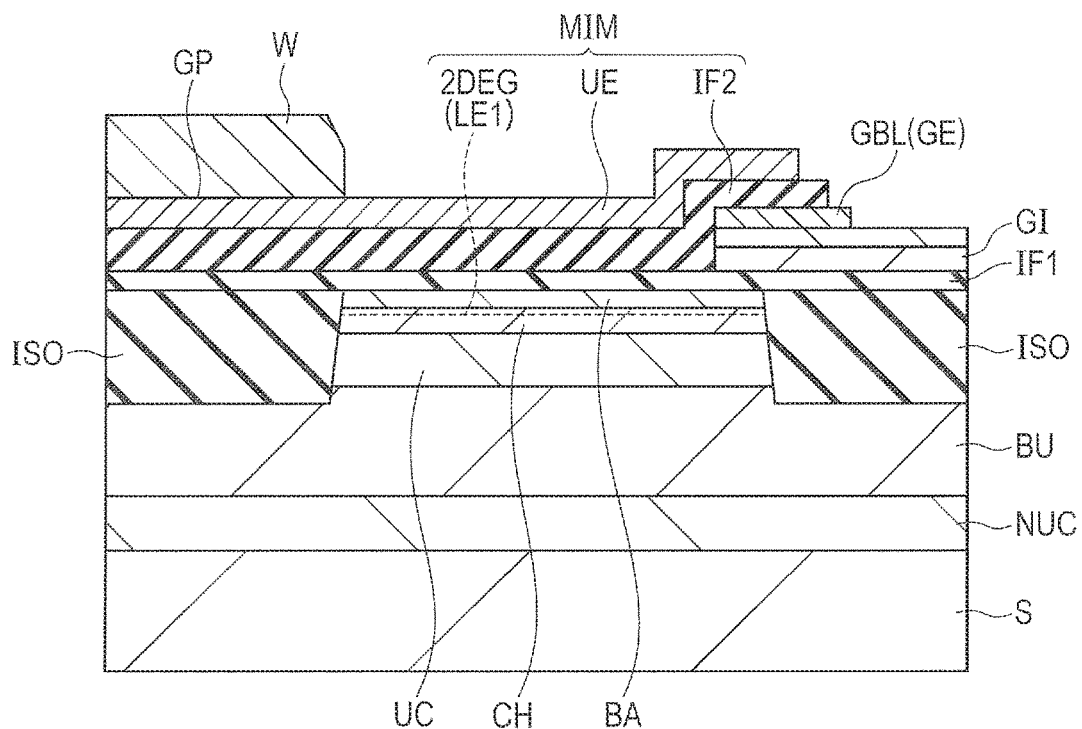
FIG. 27 is a sectional diagram illustrating one example of the configuration of the semiconductor device according to the third embodiment.

FIG. 25 is a plan view illustrating one example of a configuration of a semiconductor device according to a third semiconductor embodiment. FIG. 26 and FIG. 27 each is a sectional diagram, illustrating one example of the configuration of the semiconductor device according to the third embodiment. FIG. 26 corresponds to, for example, an A-A sectional part in FIG. 25 and FIG. 27 corresponds to, for example, a B-B sectional part in FIG. 25. The semiconductor device according to the third embodiment is the recessed gate type semiconductor device. Incidentally, the same symbols are assigned to parts similar to those in the first embodiment and description thereof is omitted.

In the third embodiment, as illustrated in FIG. 25, each MIM section MIM is provided in the vicinity of the gate pad region GP (also called the gate lead-out section) which, is provided on one side (on the left side in FIG. 25) in the X-axis direction, of the gate bus line GBL. The third embodiment is the same as the second embodiment in this point.

Then, in the third embodiment, as illustrated in FIG. 26, the gate insulating film GI2 and the gate electrode GE2 are not formed on the gate electrode GE. The third embodiment is different from the second embodiment in this point.

In addition, in the third embodiment, as illustrated in FIG. 25 to FIG. 27, each MIM section MIM is configured by an active region ACL in which the two-dimensional electron gas (2DEG) which, serves as each of the lower electrodes LE1 and LE2, the insulating film IF2 formed on the active region ACL and the upper electrode UE formed on the insulating film IF2. The third embodiment is different from the second embodiment in this point. Incidentally, the Al wire (the Al electrode) W is provided in the gate pad region GP arranged on the upper electrode UE. That is, the drive voltage is applied to the upper electrode UE via the gate pad region GP. On the other hand, each of the lower electrodes LE1 and LE2 is electrically separated from the upper electrode UE. The lower electrodes LE1 and LE2 are in the floating states respectively. In addition, the gate bus line GBL and the gate electrode GE are electrically separated from the upper electrode UE. The gate bus line GBL and the gate electrode GE are in the floating states. The lower electrode LE1 is electrically coupled with the gate bus line GBL and the gate electrode GE via the two-dimensional electron gas (2DEG). The same is true of the lower electrode LE2.

It becomes possible to make the apparent threshold voltage (the second drive voltage or the second threshold voltage) which is applied to the upper electrode UE higher than the original threshold voltage (the first drive voltage or the first threshold voltage) which is applied to the gate electrode GE in order to form the channel under the gate electrode GE similarly to the case of the first embodiment by providing the above-mentioned MIM section (the lower electrode LE1 (2DEG), the insulating film IF2 and the upper electrode UE) MIM.

[Description of Manufacturing Method]

Figure 28:
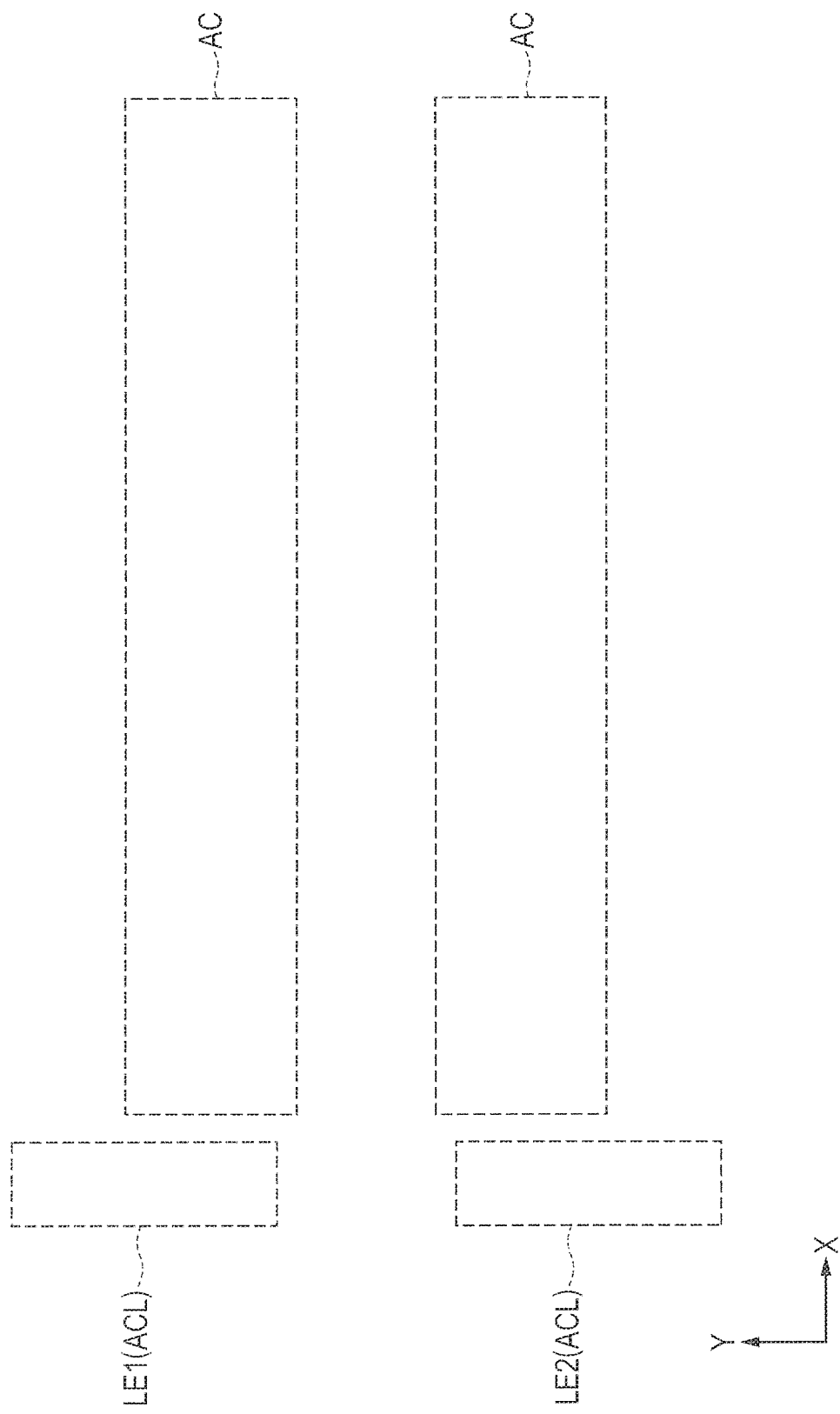
FIG. 28 is a plan view illustrating one example of a manufacturing process of the semiconductor device according to the third embodiment.
Figure 29:
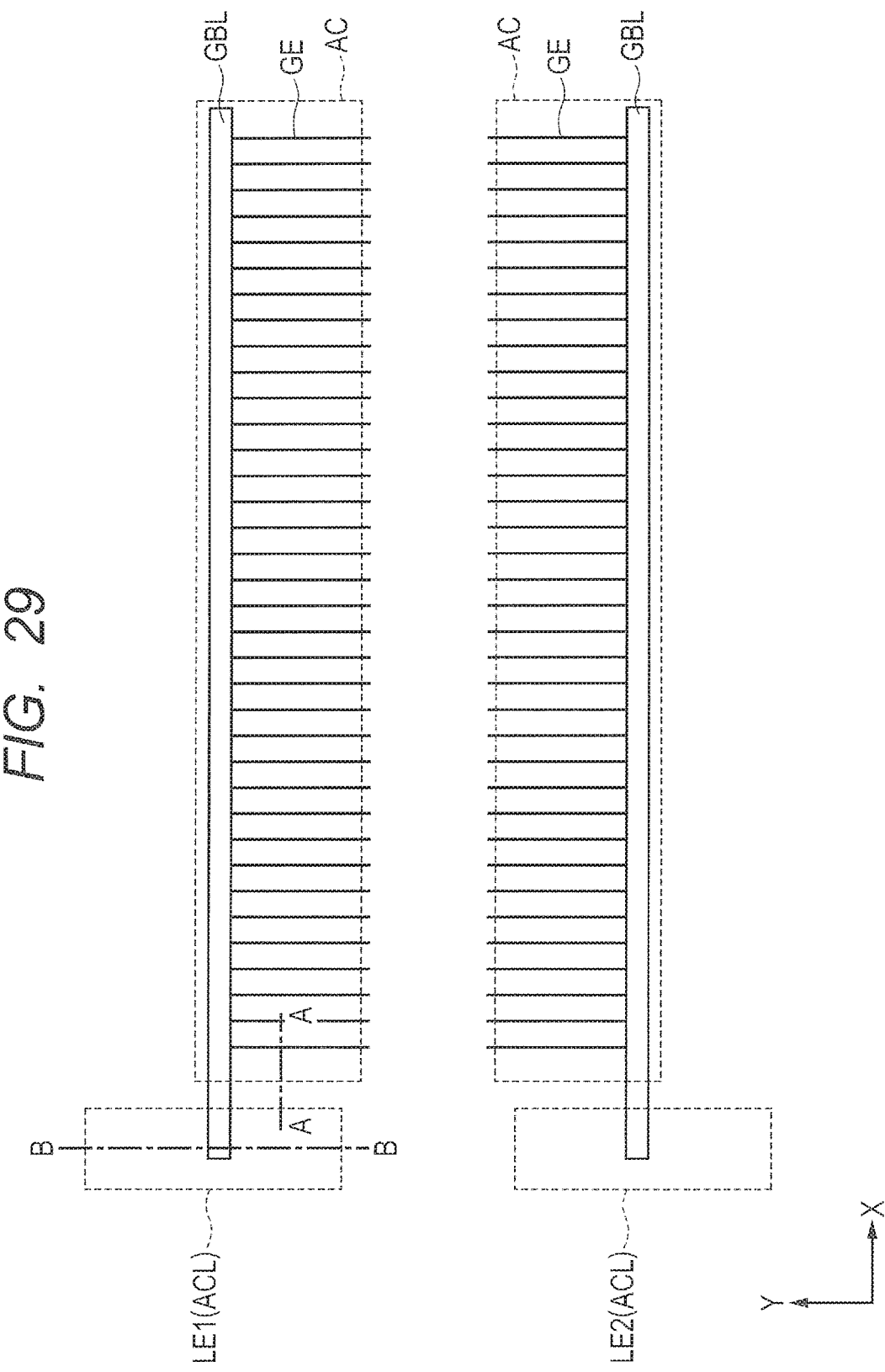
FIG. 29 is a plan view illustrating one example of the manufacturing process of the semiconductor device according to the third embodiment.
Figure 30:
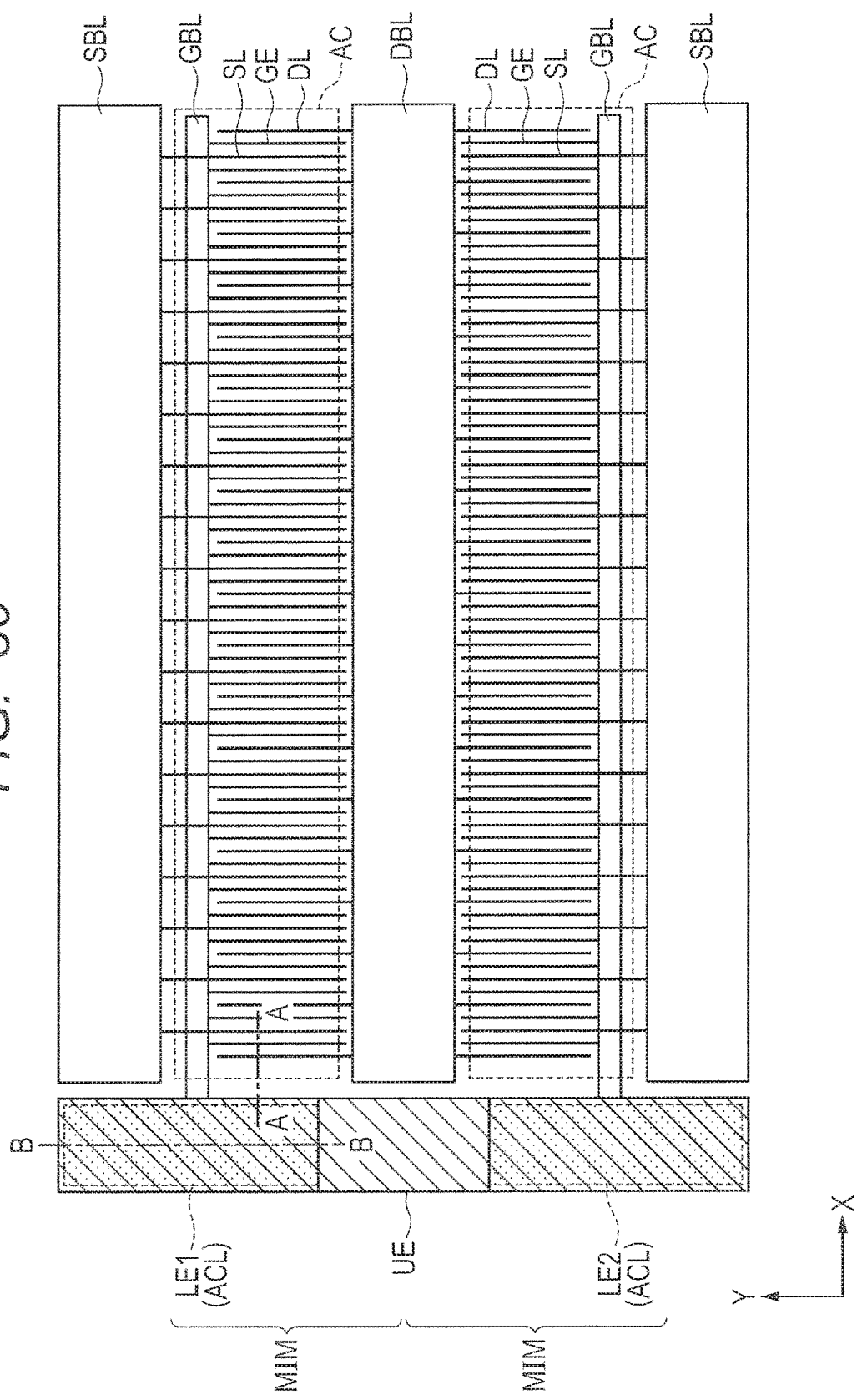
FIG. 30 is a plan view illustrating one example of the manufacturing process of the semiconductor device according to the third embodiment.

It is possible to form the semiconductor device according to the third embodiment by a process similar to the manufacturing process in the first embodiment. FIG. 28 to FIG. 30 each is a plan view illustrating one example of a process of manufacturing the semiconductor device according to the third embodiment.

First, the nucleation layer NUC, the buffer layer BU, the channel underlying layer UC, the channel layer CH, the barrier layer BA and the insulating film IF1 are sequentially formed on the substrate S similarly to the cases of the first and second embodiments (FIG. 26). On this occasion, as illustrated in FIG. 28, the active regions AC and ACL are formed. The active region AC is an element forming region in which the gate electrode GE, the source line SL, the drain line DL and so forth will be formed later. On the other hand, the active region ACL is a region in which the insulating film IF2 which serves as a capacitance insulating film of the MIM section MIM and the upper electrode UE will be formed later.

Then, the trench T is formed and the gate electrode GE is formed over the trench T via the gate insulating film GI (see FIG. 29 and FIG. 30) similarly to the first and second embodiments. Further, the insulating film IF2 which serves as the capacitance insulating film is formed on the active region ACL. Incidentally, the gate insulating film GI or the insulating film IF1 may be used as the capacitance insulating film.

Then, a conductive film is formed on the insulating film IF2 and is patterned, and thereby the upper electrode UE is formed (FIG. 30). Gray regions in FIG. 30 are overlapping parts of the lower electrode LE1 with the upper electrode UE and of the lower electrode LE2 with the upper electrode UE. Incidentally, the gate insulating film GI or the insulating film IF1 may be used as the capacitance insulating film and the upper electrode UE may be formed by the film which is in the same layer as the gate electrode It is possible to form the two MIM sections MIM each being configured by each of the lower electrodes LE1 and LE2 (2DEG), the insulating film IF2 and the upper electrode UE in this way.

Then, the interlayer insulating film IL1, the source line SL, the drain line DL and so forth are formed. It is possible to form these parts similarly to the first embodiment. Then, a protection film (not illustrated) is formed, the protection film and so forth arranged on the upper electrode UE to be coupled with the gate bus line GBL are removed and thereby the pad regions (GP and so forth) are formed. Then, the Al wire (the Al electrode) W is bonded into the pad region GP.

Incidentally, the third embodiment may be applied to the mesa type semiconductor device (see FIG. 19). That is, the mesa type semiconductor device (provision of the gate electrodes GE2 and the gate insulating film GI2 in the semiconductor device in FIG. 19 is omitted) may be applied in place of the recessed gate type semiconductor device (FIG. 26).

THIRD EXAMPLE

In the semiconductor device illustrated in FIG. 25 to FIG. 27, a total extension of a gate width of each of the two upper and lower transistor units in FIG. 25 is about 200 mm and a gate width is about 1 μm. An area of one MIM section MIM in FIG. 25 is determined by over the lapping parts of the upper electrode UE with the lower electrode LE1 and, for example, its length is about 300 μm and its width is about 200 μm.

A gate capacitance for one transistor unit is about 310 pF and a capacitance of the MIM section MIM which is coupled in series with this transistor unit is about 125 pF. The semiconductor device is designed such that a voltage division ratio of the transistor to the MIM section MIM becomes almost 2:5. When the Id-Vgs characteristic and the Cg-Vgs characteristic were measured by using the above-mentioned semiconductor device, a waveform which was enlarged about 3.5 times in the Vgs direction was obtained in each of the characteristics and it was confirmed that the designed voltage division ratio (2:5) is realized.

Fourth Embodiment

Although in the second embodiment, the MIM section MIM is formed in the element separation region, a resistor R may be coupled between the upper electrode UE and the lower electrode LE of the MIM section MIM.

[Description of Structure]

Figure 31:
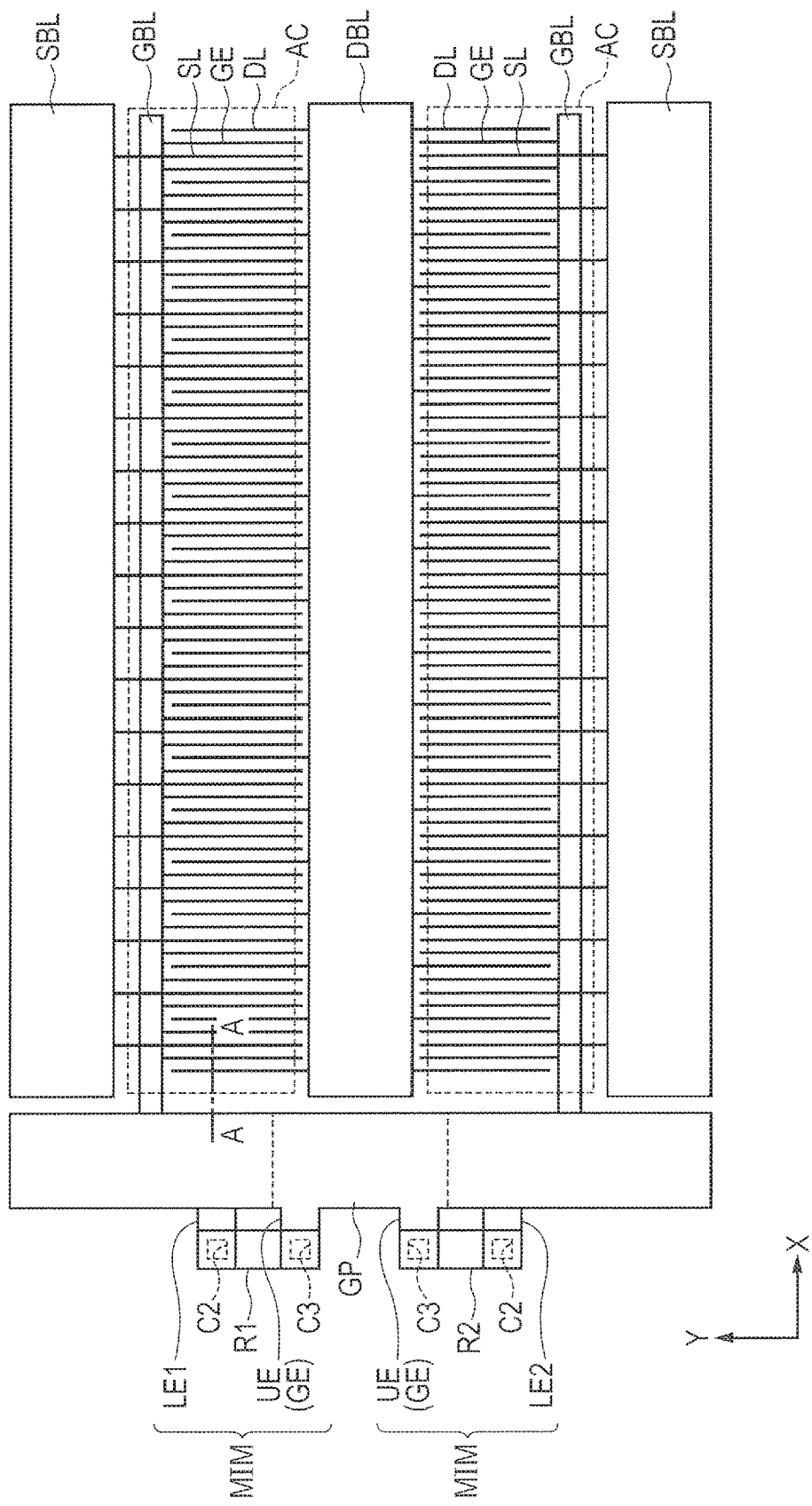
FIG. 31 is a plan view illustrating one example of a configuration of a semiconductor device according to a fourth embodiment.
Figure 32:
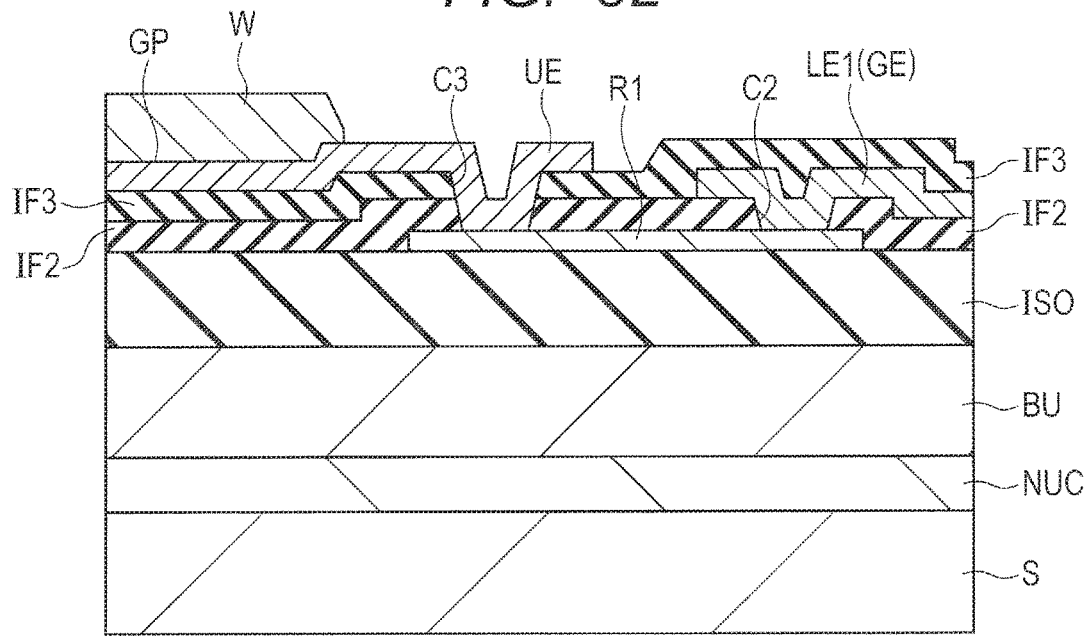
FIG. 32 is a sectional diagram illustrating one example of the configuration of the semiconductor device according to the fourth embodiment.
Figure 33:
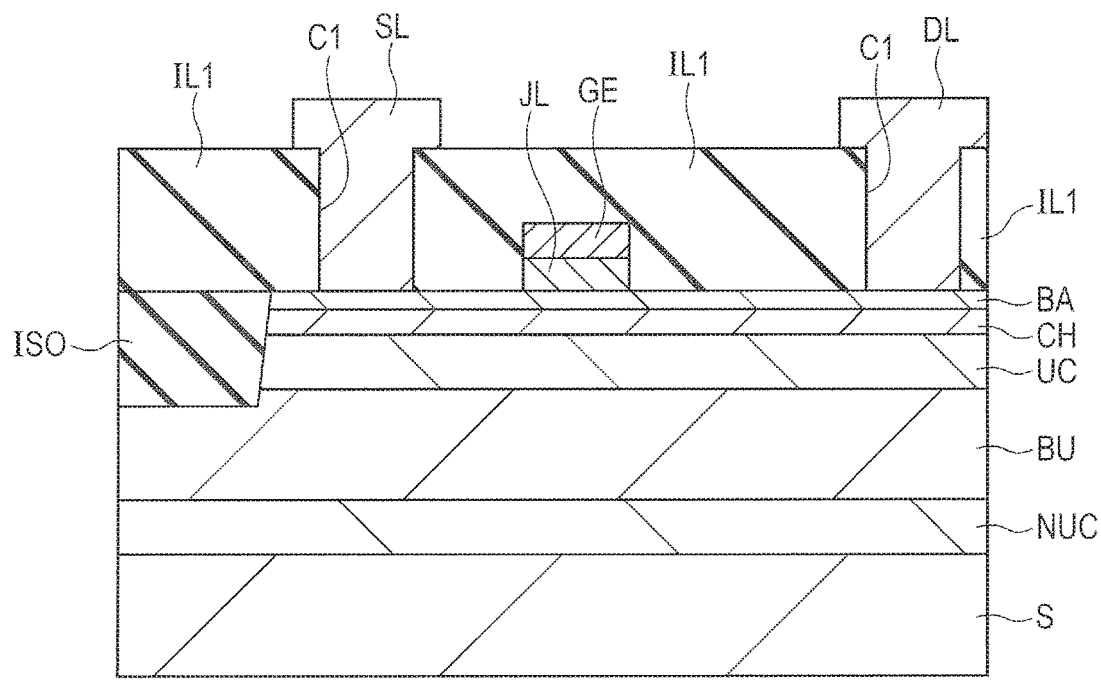
FIG. 33 is a sectional diagram illustrating one example of the configuration of the semiconductor device according to the fourth embodiment.

FIG. 31 is a plan view illustrating one example of a configuration of a semiconductor device according to a fourth embodiment. FIG. 32 and FIG. 33 each is a sectional diagram illustrating one example of the semiconductor device according to the fourth embodiment. FIG. 32 corresponds to, for example, a B-B sectional part in FIG. 31 and FIG. 33 corresponds to, for example, an A-A sectional part in FIG. 31. The semiconductor device according to the fourth embodiment is a JEFT (junction gate field-effect transistor) type semiconductor device. Incidentally, the same symbols are assigned to the parts similar to those in the first embodiment and description thereof is omitted.

As illustrated in FIG. 33, in the semiconductor device according to the fourth embodiment, the nucleation layer NUC, the buffer layer BU, the channel underlying layer UC, the channel layer CH and the barrier layer BA are sequentially formed on the substrate S similarly to the case of the first embodiment. Materials which are similar to those used in the first embodiment, may be used as constituent materials of these layers.

In addition, the JFET according to the fourth embodiment includes the gate electrode GE which is formed on the barrier layer BA via a p-type nitride semiconductor layer (a mesa type gate junction layer, for example, a p-type GaN layer) JL, and the source line SL and the drain line DL which are formed on the barrier layer BA respectively on the both sides of the gate electrode GE. This semiconductor element is formed in the active region AC which is partitioned by the element separation region ISO. The nitride semiconductor layer (the gate junction layer) JL is equal to or larger than, the barrier layer BA in electron affinity. In addition, it is preferable that the nitride semiconductor layer (the gate junction layer) JL be Schottky-joined with the gate electrode GE.

Then, the source line SL and the drain, line DL are formed, on the barrier layer BA. Materials which are similar to those used in the first embodiment may be used as the constituent materials of the source line SL and the drain line DL. In addition, the interlayer insulating film IL1 is formed on the gate electrode GE. A material which, is similar to that used in the first embodiment may be used as the constituent material of the interlayer insulating film IL1.

Then, as illustrated in FIG. 31, the above-mentioned gate electrode GE, source line SL and the drain line DL have planar shapes similar to those in the second embodiment. For example, as described with reference to FIG. 23 and FIG. 24, the gate electrodes GE and the gate bus line GBL are formed into the pectinate shape and the gate bus line GBL is coupled with the lower electrode LE1. In addition, the upper electrode UE is formed on the lower electrode LE1 via the insulating film IF2.

As illustrated in FIG. 31 and FIG. 32, in the fourth embodiment, a resistor R1 which is configured by a polysilicon film and so forth is provided between the lower electrode LE1 and the upper electrode UE. In addition, a resistor R2 which is also configured by the polysilicon film and so forth is provided between the lower electrode LE2 and the upper electrode UE.

Although there is no limitation on coupling structures of the lower electrode LE1 with the resistor R1 and of the upper electrode UE with the resistor R1, it is possible to exemplify forms illustrated in FIG. 32 as the coupling structures. As illustrated in FIG. 32, the resistor (the polysilicon film) R1 is formed on the element separation region ISO and one end of the resistor R1 and the lower electrode LE1 are coupled together via a contact hole formed in the insulating film IF2. In addition, the other end of the resistor R1 and the upper electrode UE are coupled together via a contact hole formed in the insulating film IF2 and an insulating film IF3.

In the JFET type FET, it is possible to suppress the gate leakage current and thereby to avoid a variation in gate potential by providing the resistors R1 and R2 and coupling the resistors R1 and R2 respectively in parallel with the MIM sections (the lower electrode LE1 section and the lower electrode LE2 section) in this way.

[Description of Manufacturing Method]

It is possible to form the semiconductor device according to the fourth embodiment by a process similar to the manufacturing process used in the first embodiment.

First, the nucleation layer NUC, the buffer layer BU, the channel underlying layer UC, the channel layer CH and the barrier layer BA are sequentially formed on the substrate S and thereby the element separation region ISO is formed (FIG. 33) similarly to the case of the first embodiment. Then, the polysilicon film is deposited on the element separation region ISO and is patterned, and thereby the resistor R1 is formed (FIG. 32). Then, the resistor R1 is covered with the insulating film IF2 and further the nitride semiconductor layer (the mesa type gate junction layer) JL is formed on the barrier layer BA. The nitride semiconductor layer (the mesa type gate junction layer) JL is formed by, for example, depositing and patterning the constituent material of the nitride semiconductor layer (the mesa type gate junction layer) JL. Then, a contact hole C2 is formed in the insulating film IF2 and so forth formed on the resistor R1 and then the constituent material (for example, TiN) of the gate electrode GE is deposited on the nitride semiconductor layer (the mesa type gate junction layer) JL so as to have a thickness of about 100 nm and is patterned. On this occasion, one conductive film is patterned so as to have the lower electrode LE1 which is coupled with the gate bus line GBL (see FIG. 23).

Then, the insulating film IF3 is formed on the gate electrodes GE, the gate bus line GBL and the lower electrode LE1, and on the resistor R1. Then, a contact hole C3 is formed in the insulating films IF2 and LF3 and so forth formed on the resistor R1 and then smother conductive film is formed on the contact hole C3 and is patterned, and thereby the upper electrode UE is formed, (see FIG. 32 and FIG. 24).

Then, the interlayer insulating film IL1, the source line SL, the drain line DL and so forth are formed similarly to the case in the first embodiment (FIG. 33).

FOURTH EXAMPLE

A withstand voltage of the semiconductor device illustrated in FIG. 31 to FIG. 33 is, for example, about 600 V. In addition, in the semiconductor device illustrated in FIG. 31 to FIG. 33, a total extension of a gate width of each of the two upper and lower transistor units (the upper pectinate part and the lower pectinate part in FIG. 31) in FIG. 31 is about 200 mm and the gate width is about 1 μm. A capacitance of the MIM section MIM which is coupled in series with this unit is about 210 pF. The semiconductor device is designed such that a voltage division ratio of the transistor to the MIM section MIM becomes about 2:1.

Figure 34A:
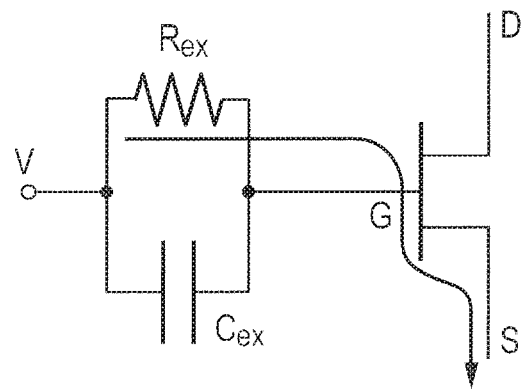
FIG. 34A is a circuit diagram illustrating one example of the configuration of the semiconductor device according to the fourth embodiment.
Figure 34B:
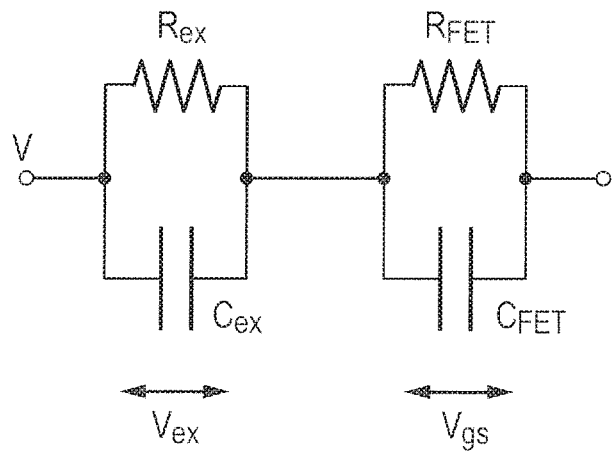
FIG. 34B is a circuit diagram illustrating one example of a circuit which is equivalent to a circuit illustrated in FIG. 34A.

In the JFET type FET, since the gate insulating film is not included as illustrated in FIG. 33, when a positive bias is applied to the gate, a small amount of gate leakage current flows. FIG. 34A and FIG. 34B each is a circuit diagram illustrating one example of a configuration of the semiconductor device according to the fourth embodiment. FIG. 34A is a circuit diagram illustrating one example of the configuration of the semiconductor device according to the fourth embodiment and FIG. 34B is a circuit diagram illustrating one example of an equivalent circuit.

It is thought that when the MIM section MIM is coupled in series with the gate of the JFET type FET and a gate-on-state is maintained, the gate leakage current flows and a potential of the gate of the JFET is gradually increased, and when a sufficiently long time elapses, a voltage applied to the gate of the JFET approaches 0 V. It is desirable to design such that a resistor Rex is coupled in parallel with the MIM section MIM and thereby a voltage division ratio of a gate resistor to the resistor Rex of the JFET becomes almost equal to the voltage division ratio (about 2:1) of the transistor to the MIM section MIM in capacitance even when the gate leakage current flows in order to ensure stability of the gate potential. Here, since the gate leakage current which flows when an on-voltage Von of the JFET=about 4 V is about 1 mA per transistor unit (Rgs=about 4 kΩ), the resistance of the resistor Rex was set to about 2 kΩ such that the voltage division ratio between the resistors becomes about 2:1.

When the Id-Vgs characteristic and the Cg-Vgs characteristic were measured by using the semiconductor device that the MIM section MIM and the resistor are provided on the same chip as the transistor, a waveform which was enlarged about 1.5 times in the Vgs direction was obtained in each of the characteristics and therefore it was confirmed that the designed voltage division ratio (about 2:1) is realized.

Next, the above-mentioned semiconductor device was enclosed into a package and applied to the high side of the back converter circuit and a continuous switching operation was performed under conditions of about 400 V in power source voltage, about 10 Ω in gate external resistance, about 6 V in gate voltage (corresponding to about 4 V of the gate voltage of the JFET) and about 100 kHz in frequency. When a time-dependent change in efficiency (input power/output power) was measured under conditions of about 200 V in output voltage and about 1 kW in output power, although the efficiency was reduced from 95% to 94% immediately after start of the operation, the later efficiency was stabilized and therefore it was confirmed that the above-mentioned semiconductor device stably works also in a long-lasting continuous operation.

It is preferable that the resistor (Rex) be coupled in parallel with the MIM section MIM and the resistance of the resistor (ReX) be adjusted such that a ratio of a divided voltage applied to a gate resistor (Rgs) to a divided voltage applied to the resistor (Rex) of the JFET, that is, the voltage division ratio of the gate resistor to the resistor Rex of the JFET in a state where the resistor R (Rex) is coupled in parallel with the MIM section MIM and the FET is in the on-state (a state where the gate leakage current is flowing) becomes almost equal to a ratio of a divided voltage applied to a gate capacitor (Cgs) of the FET to a divided voltage applied to a capacitor (Cex) of the MIM section MIM, that is, the voltage division ratio of the transistor to the MIM section MIM in capacitance.

Incidentally, although in the fourth embodiment, the JFET which is equipped with the nitride semiconductor layer (the mesa type gate junction layer made of, for example, p-type GaN) JL is described by way of example, the fourth embodiment maybe also applied to a MESFET equipped with a Schottky gate.

Although the invention made by the inventors and other has been specifically described on the basis of the preferred embodiments, it goes without saying that the present invention is not limited to the above-mentioned embodiments and may be altered and modified in a variety of ways within a range not deviating from the gist of the present invention.

For example, the JFET which is described in the fourth embodiment may be applied in place of the recessed gate type and mesa type MISFETs described in the first to third embodiment. In addition, any one of the recessed gate type and mesa type MISFETs described in the first to third embodiment may be applied in place of the JFET described in the fourth embodiment.

In addition, it goes without saying that the above-mentioned respective embodiments are not limited to the numerical values given in the respective examples and these numerical values may be changed in a variety of ways within a range not deviating from the gist of the present invention.

[Additional Remark 1]

A semiconductor device including a first nitride semiconductor layer which is formed in a first active region of a substrate which includes the first active region and a first region arranged adjacent to the first active region, a second nitride semiconductor layer which is formed over the first nitride semiconductor layer, a trench which passes through the second nitride semiconductor layer and reaches the middle of the first nitride semiconductor layer, a first gate electrode section which is formed in the trench via a first insulating film, a first electrode and a second electrode which are formed over the second nitride semiconductor layer respectively on the both sides of the first gate electrode section, a lower-layer electrode which is configured by a second active region, a second insulating film which is formed over the lower-layer electrode, and an upper-layer electrode which is formed over the second insulating film, in which electron affinity of the second nitride semiconductor layer is smaller than the electron affinity of the first nitride semiconductor layer, the first, region includes the lower-layer electrode configured by the second, active region and an element separation region, which surrounds the lower-layer electrode, the upper-layer electrode and the lower-layer electrode include parts which mutually overlap in planar view, and the lower-layer electrode is separated from the upper-layer electrode via the second insulating film.

[Additional Remark 2]

In the semiconductor device described in the additional remark 1, a drive voltage is applied to the upper-layer electrode, and the lower-layer electrode is in a floating state.

[Additional Remark 3]

In the semiconductor device described in the additional remark 1, the upper-layer electrode is coupled with a pad electrode.

[Additional Remark 4]

In the semiconductor device described in the additional remark 1, the first gate electrode section includes a first wiring part which extends in a first direction and a first gate part which extends from the first wiring part in a second direction which intersects with the first direction, and the upper-layer electrode is coupled with the first wiring part,

[Additional Remark 5]

A semiconductor device including a first nitride semiconductor layer which is formed in a first active region of a substrate which includes the first active region and a first region arranged adjacent to the first active region, a second nitride semiconductor layer which is formed over the first nitride semiconductor layer, a mesa section which is configured by a third nitride semiconductor layer formed over the second nitride semiconductor layer, a first gate electrode section which is formed over the mesa section, a first electrode and a second electrode which are formed over the second nitride semiconductor layer respectively on the both sides of the first gate electrode section, a lower-layer electrode which is configured by a second active region, a capacitance insulating film which is formed over the lower-layer electrode, and an upper-layer electrode which is formed over the capacitance insulating film, in which electron affinity of the second nitride semiconductor layer is smaller than the electron affinity of the first nitride semiconductor layer, the mesa section is formed over the second nitride semiconductor layer between the first electrode and the second, electrode and the third, nitride semiconductor layer is a p-type layer, the first region includes the lower-layer electrode configured by the second active region and an element separation region which surrounds the lower-layer electrode, the upper-layer electrode and the lower-layer electrode include parts which mutually overlap in planar view in the first region, and the lower-layer electrode is separated from the upper-layer electrode via the capacitance insulating film,

[Additional Remark 6]

In the semiconductor device described in the additional remark 5, a drive voltage is applied to the upper-layer electrode, and the lower-layer electrode is in a floating state.

[Additional Remark 7]

In the semiconductor device described in the additional remark 5,

The upper-layer electrode is coupled with a pad electrode.

[Additional Remark 8]

In the semiconductor device described in the additional remark 5, the first gate electrode section includes a first wiring part which extends in a first direction and a first gate part which extends from the first wiring part in a second direction which intersects with the first direction, and the upper-layer electrode is coupled with the first wiring part.

[Additional Remark 9]

A semiconductor device including a first nitride semiconductor layer which is formed in an active region of a substrate which includes the active region and an element separation region arranged adjacent to the active region, a second nitride semiconductor layer which is formed over the first nitride semiconductor layer, a junction section which is configured by a p-type third nitride semiconductor layer formed over the second nitride semiconductor layer, a first gate electrode section which is formed over the junction section, a first electrode and a second electrode which are formed over the second nitride semiconductor layer respectively on the both sides of the first gate electrode section, a lower-layer electrode which is formed in the element separation region and is coupled with the first gate electrode section, a capacitance insulating film which is formed over the lower-layer electrode, and an upper-layer electrode which is formed over the capacitance insulating film, in which electron affinity of the second nitride semiconductor layer is smaller than the electron affinity of the first nitride semiconductor layer, the upper-layer electrode and the lower-layer electrode include parts which mutually overlap in a planar view in the element separation region, and the lower-layer electrode is separated from, the upper-layer electrode via the capacitance insulating film,

[Additional Remark 10]

In the semiconductor device described in the additional remark 9, the semiconductor device includes a resistor which is coupled between the upper-layer electrode and the lower-layer electrode,

[Additional Remark 11]

A method of manufacturing semiconductor device including the steps of (a) forming a first nitride semiconductor layer over a substrate, (b) forming a second nitride semiconductor layer over the first nitride semiconductor layer, (c) forming a first gate electrode section over the first nitride semiconductor layer or the second nitride semiconductor layer via a first insulating film, (d) forming a first electrode and a second, electrode over the second nitride semiconductor layer on the both sides of the first gate electrode section, (e) forming a capacitance insulating film over the first gate electrode section, and (f) forming a second gate electrode section over the capacitance insulating film, in which electron affinity of the second nitride semiconductor layer is smaller than the electron affinity of the first nitride semiconductor layer, the seconds gate electrode section and the first gate electrode section includes parts which mutually overlap in planar view, and the second gate electrode section is separated from the first gate electrode section via the capacitance insulating film.

What is claimed is:

1. A semiconductor device comprising:

a first nitride semiconductor layer which is formed over a substrate;

a second nitride semiconductor layer which is formed over the first nitride semiconductor layer;

a trench which passes through the second nitride semiconductor layer and reaches the middle of the first nitride semiconductor layer;

a first gate electrode section which is formed in the trench via a first insulating film;

a first electrode and a second electrode which are formed over the second nitride semiconductor layer respectively on the both sides of the first gate electrode section;

a second insulating film which is formed over the first gate electrode section; and a second gate electrode section which is formed over the second insulating film, wherein electron affinity of the second nitride semiconductor layer is smaller than the electron affinity of the first nitride semiconductor layer, wherein the second gate electrode section and the first gate electrode section include parts which mutually overlap in planar view, and wherein the second gate electrode section is separated from the first gate electrode section via the second insulating film.

2. The semiconductor device according to claim 1, wherein a drive voltage is applied to the second gate electrode section, and wherein the first gate electrode section is in a floating state.

3. The semiconductor device according to claim 1, wherein the first gate electrode section and the second gate electrode section are formed in an active region, and wherein the second gate electrode section is coupled with a pad electrode which is provided in an element separation region arranged adjacent to the active region.

4. The semiconductor device according to claim 1, wherein the first gate electrode section includes a first wiring part which extends in a first direction and a first gate part which extends from the first wiring part in a second direction which intersects with the first direction, wherein the second gate electrode section includes a second wiring part which extends in the first direction and a second gate part which extends from the second wiring part in the second direction, wherein the first wiring part and the second wiring part, include parts which mutually overlap in planar view, and wherein the first gate part and the second gate part include parts which mutually overlap in planar view.

5. The semiconductor device according to claim 1, wherein the second gate electrode section includes a second wiring part which extends in a first direction and a second, gate part which extends from the second wiring part in a second direction which intersects with the first direction, and wherein the first gate electrode section does not include a first wiring part which overlaps with the second wiring part and includes a first gate part which overlaps with the second gate part.

* * * * *